(12) United States Patent
Ko et al.

(10) Patent No.: US 11,984,368 B2
(45) Date of Patent: May 14, 2024

(54) DISPLAY DEVICE

(71) Applicant: Samsung Display Co., LTD., Yongin-si (KR)

(72) Inventors: Seung Cheol Ko, Hwaseong-si (KR); Young Suk Lee, Hwaseong-si (KR); Yong Jun Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 524 days.

(21) Appl. No.: 17/350,738

(22) Filed: Jun. 17, 2021

(65) Prior Publication Data
US 2022/0044976 A1 Feb. 10, 2022

(30) Foreign Application Priority Data
Aug. 7, 2020 (KR) .................. 10-2020-0099379

(51) Int. Cl.
H01L 21/66 (2006.01)
H01L 27/15 (2006.01)
H01L 33/24 (2010.01)
H01L 33/62 (2010.01)

(52) U.S. Cl.
CPC ............ *H01L 22/32* (2013.01); *H01L 27/156* (2013.01); *H01L 33/24* (2013.01); *H01L 33/62* (2013.01)

(58) Field of Classification Search
None
See application file for complete search history.

(56) References Cited

U.S. PATENT DOCUMENTS

| 2015/0098643 | A1* | 4/2015 | Lee | ............... G06T 7/001 |
| | | | | 382/149 |
| 2016/0025484 | A1* | 1/2016 | Kim | ............... G03F 7/70633 |
| | | | | 356/614 |
| 2019/0244985 | A1* | 8/2019 | Kim | ............... H01L 27/124 |

FOREIGN PATENT DOCUMENTS

| KR | 10-2019-0124359 | 11/2019 |
| KR | 10-2020-0053726 | 5/2020 |

* cited by examiner

Primary Examiner — Robert K Carpenter
(74) Attorney, Agent, or Firm — KILE PARK REED & HOUTTEMAN PLLC

(57) ABSTRACT

A display device includes a light emitting area and a sub-area disposed at a side of the light emitting area, a measurement area disposed in the sub-area, measurement patterns and a first electrode extension portion being disposed in the measurement area, a first electrode and a second electrode that are disposed in the light emitting area and spaced apart from each other, and face each other, a first insulating layer disposed on the first electrode and the second electrode, at least a part of the first insulating layer being disposed on the first electrode extension portion, and at least one light emitting element having ends disposed on the first electrode and the second electrode in the light emitting area. The measurement area includes a first measurement area in which a first measurement hole exposing a part of an upper surface of the first electrode extension portion is disposed.

20 Claims, 17 Drawing Sheets

DISPLAY DEVICE

CROSS-REFERENCE TO RELATED APPLICATION(S)

This application claims priority to and benefits of Korean Patent Application No. 10-2020-0099379 under 35 U.S.C. § 119, filed on Aug. 7, 2020 in the Korean Intellectual Property Office, the contents of which in its entirety are herein incorporated by reference.

BACKGROUND

1. Field of the Invention

The disclosure relates to a display device.

2. Description of the Related Art

Importance of display devices and the use thereof has increased and is increasing as multimedia has been developed and is under development. Various types of display devices such as organic light emitting displays and liquid crystal displays have been developed and are still under development for their uses in various products, industries and markets.

A display device displays images and includes a display panel such as an organic light emitting display panel or a liquid crystal display panel. A display panel or a light emitting display panel may include light emitting elements such as light emitting diodes (LEDs). For example, an LED may be an organic light emitting diode (OLED) using an organic material as its fluorescent material or may be an inorganic LED using an inorganic material as its fluorescent material.

SUMMARY

Embodiments are provided to describe a display device including measurement patterns capable of measuring the intervals and overlay between other conductive layers and insulating layers in a pixel.

However, the invention is not limited to the embodiments.

According to an embodiment, a display device may include a light emitting area and a sub-area disposed at a side of the light emitting area, a measurement area disposed in the sub-area, measurement patterns and a first electrode extension portion being disposed in the measurement area, a first electrode and a second electrode that are disposed in the light emitting area and spaced apart from each other, and face each other, a first insulating layer disposed on the first electrode and the second electrode, at least a part of the first insulating layer being disposed on the first electrode extension portion, and at least one light emitting element having ends disposed on the first electrode and the second electrode in the light emitting area, wherein the measurement area may include a first measurement area in which a first measurement hole exposing a part of an upper surface of the first electrode extension portion may be disposed.

The display device may further comprise a second insulating layer disposed on the at least one light emitting element and at least partially disposed in the measurement area, wherein the measurement area may further include a second measurement area spaced apart from the first measurement area, and a second measurement hole exposing a part of an upper surface of the first insulating layer may be disposed in the second measurement area.

The display device may further comprise a first measurement electrode disposed in the first measurement area and partially overlapping the first measurement hole, and a second measurement electrode disposed in the second measurement area and partially overlapping the second measurement hole.

The display device may further comprise a first contact electrode disposed in the light emitting area and contacting the first electrode and an end of the at least one light emitting element, and a second contact electrode disposed in the light emitting area and contacting the second electrode and another end of the at least one light emitting element, wherein the first measurement electrode and the first contact electrode may include a same material, and the second measurement electrode and the second contact electrode may include a same material.

Each of the first measurement electrode and the second measurement electrode may do not contact the first electrode extension portion.

The first measurement hole may include a first pattern portion extending in a first direction, and a second pattern portion spaced apart from the first pattern portion in a second direction and extending in the second direction, and the first pattern portion may be spaced apart from a side of the first electrode extension portion.

The first measurement electrode may include a third pattern portion overlapping the second pattern portion, spaced apart from the first pattern portion in the second direction and extending in the first direction, and a fourth pattern portion overlapping the first pattern portion, spaced apart from the second pattern portion in the second direction and extending in second first direction.

A width of the first pattern portion in the first direction may be greater than a width of the fourth pattern portion in the first direction, and a length of the first pattern portion in the second direction may be shorter than a length of the fourth pattern portion in the second direction.

The second measurement hole may include a fifth pattern portion extending in a first direction, and a sixth pattern spaced apart from the fifth pattern in a second direction and extending in the second direction, and the fifth pattern portion may be spaced apart from a side of the first electrode extension portion.

The second measurement electrode may include a seventh pattern portion overlapping the sixth pattern portion, spaced apart from the fifth pattern portion in the second direction and extending in the first direction, and an eighth pattern portion overlapping the fifth pattern portion, spaced apart from the sixth pattern portion in the second direction and extending in the second direction.

The second insulating layer may be disposed on the first insulating layer of the first measurement area, and the first measurement electrode may be directly disposed on the second insulating layer.

The display device may further comprise a third insulating layer disposed on the at least one light emitting element and at least partially disposed in the measurement area, wherein the third insulating layer may be disposed on the second insulating layer of the measurement area, and the second measurement electrode may be disposed directly on the third insulating layer.

The measurement area may further include a third measurement area spaced apart from the second measurement area, and a third measurement hole exposing a part of an upper surface of the second insulating layer may be disposed in the third measurement area.

The measurement area may further include a fourth measurement area spaced apart from the first measurement area and including a first measurement electrode directly disposed on the first insulating layer in which the first measurement hole is not disposed, and a fifth measurement area spaced apart from the fourth measurement area and including a second measurement electrode directly disposed on the second insulating layer in which the second measurement hole is not disposed.

The first electrode extension portion may be directly connected to the first electrode and include a first bank disposed under the first electrode and a second bank disposed under the second electrode, and the first bank may include a bank extension portion disposed under the first electrode extension portion and having a larger width than a width of the first electrode extension portion.

According to an embodiment, a display device may include a light emitting area, a sub-area disposed at a side of the light emitting area, a measurement area disposed in the sub-area and including an electrode extension portion and measurement patterns disposed on the electrode extension portion. The measurement area may include a first insulating layer disposed on the electrode extension portion, a second insulating layer disposed on the first insulating layer, a third insulating layer disposed on the second insulating layer, a first measurement hole penetrating the first insulating layer to expose a part of an upper surface of the electrode extension portion, a first measurement area in which a first measurement electrode disposed on the second insulating layer and partially overlapping the first measurement hole is disposed, a second measurement hole spaced apart from the first measurement area and penetrating the second insulating layer to expose a part of an upper surface of the first insulating layer, and a second measurement area in which a second measurement electrode disposed on the third insulating layer and partially overlapping the second measurement hole is disposed.

The first measurement hole may include a first pattern portion extending in a first direction and spaced apart from a side of the electrode extension portion, and a second pattern portion spaced apart from the first pattern portion in a second direction and extending in the second direction, and the first measurement electrode may include a third pattern portion overlapping the second pattern portion, spaced apart from the first pattern portion in the second direction, and extending in the first direction, and a fourth pattern portion overlapping the first pattern portion, spaced apart from the second pattern portion in the second direction, and extending in the second direction.

The display device may further comprise a third measurement area spaced apart from the second measurement area, wherein a third measurement hole penetrating the third insulating layer to expose a part of an upper surface of the second insulating layer may be disposed in the third measurement area.

The display device may further comprise a first electrode disposed in the light emitting area and connected to the electrode extension portion, a second electrode spaced apart from the first electrode, at least one light emitting element arranged on the first electrode and the second electrode, and a first contact electrode contacting an end of the at least one light emitting element and the first electrode, and a second contact electrode contacting another end of the at least one light emitting element and the second electrode, wherein the first insulating layer may be disposed between the at least one light emitting element and each of the first electrode and the second electrode, and the second insulating layer may be disposed between the at least one light emitting element and the first contact electrode.

The display device may further comprise a first bank disposed under the first electrode, and a second bank disposed under the second electrode, wherein the first bank may include a bank extension portion disposed under the electrode extension portion and having a larger width than a width of the electrode extension portion.

BRIEF DESCRIPTION OF THE DRAWINGS

The above and other aspects and features of the embodiments will become more apparent by describing in detail with reference to the attached drawings, in which.

DETAILED DESCRIPTION OF THE EMBODIMENTS

Figure 1:
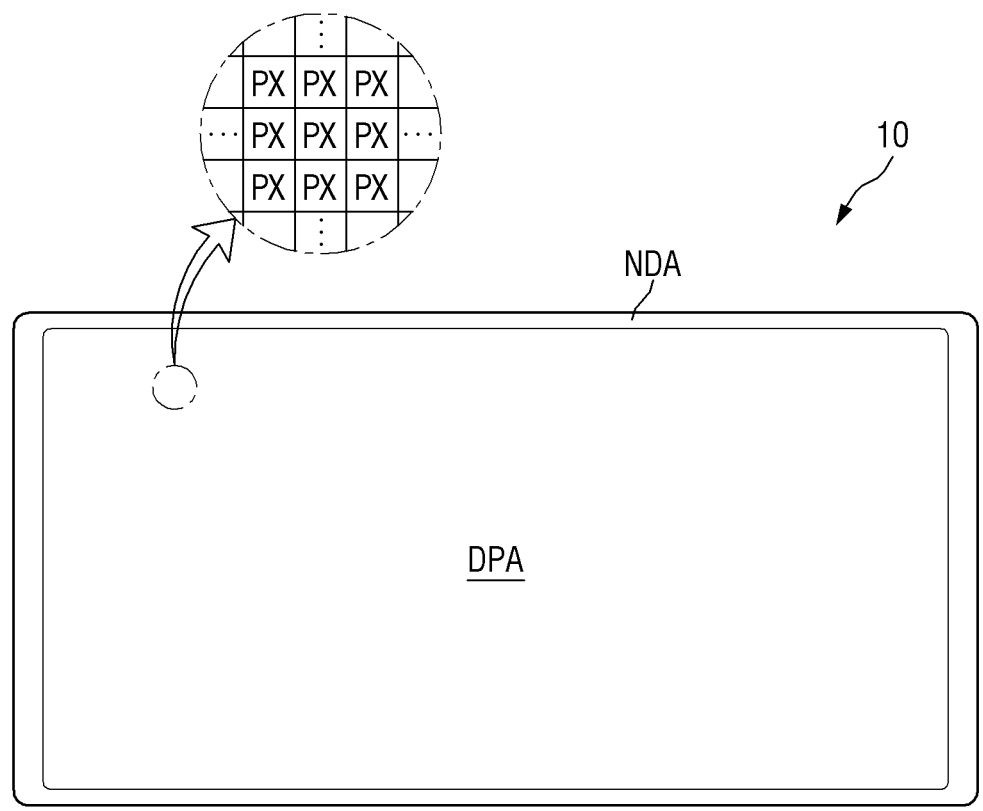
FIG. 1 is a schematic plan view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Spatially relative terms, such as "beneath," "below," "under," "lower," "above," "upper," "over," "higher," "side" (for example, as in "sidewall"), and the like, may be used herein for descriptive purposes, and, thereby, to describe one or an elements' relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features may then be oriented "above" the other elements or features. Thus, the example term "below" can encompass both an orientation of above and below. Furthermore, the apparatus may be otherwise oriented (for example, rotated 90 degrees or at other orientations), and, as such, the spatially relative descriptors used herein interpreted accordingly.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, embodiments of the invention will be described with reference to the attached drawings.

FIG. 1 is a schematic plan view of a display device according to an embodiment.

In the specification, "upper portion", "top", or "upper surface" refers to one direction of an upper direction, that is, a third direction DR3 with respect to a display device 10, and "lower portion", "bottom", or "lower surface" refers to the other direction of the third direction DR3. Further, "left", "right", "upper", or "lower" refers to a direction when the display device 10 is viewed in a plan view. For example, "left" refers to one direction of a first direction DR1, "right" refers to the other direction of the first direction DR1, "upper" refers to one direction of a second direction DR2, and "right" refers to the other direction of the second direction DR2.

Referring to FIG. 1, a display device 10 displays a mobile image or a still image. The display device 10 may refer to any electronic device that provides a display screen. For example, the display device 10 may be used in televisions, notebooks, monitors, billboards, internet of things, mobile phones, smart phones, tablet personal computers (PCs), electronic watches, smart watches, watch phones, head mounted displays, mobile communication terminals, electronic notebooks, electronic books, portable multimedia players (PMPs), navigators, game machines, digital cameras, camcorder, and the like.

The display device 10 includes a display panel for providing a display screen. Examples of the display panel may include an inorganic light emitting diode display panel, an organic light emitting display panel, a quantum dot light emitting display panel, a plasma display panel, and a field emission display panel. Hereinafter, there will be exemplified a case where an inorganic light emitting diode display panel is used as the display panel, but the display panel is not limited thereto. Any display panel may be used as the display panel as long as the same technical idea is applicable.

The shape of the display device 10 may be variously modified. For example, the display device 10 may have a shape such as a rectangle having longer horizontal sides, a rectangle having longer vertical sides, a square, a rectangle having round corners (vertexes), another polygon, or a circle. The shape of a display area DPA of the display device 10 may also be similar to the overall shape of the display device 10. FIG. 1 illustrates a display device 10 and a display area DPA each having a rectangular shape having longer horizontal sides.

The display device 10 may include a display area DPA and a non-display area NDA. The display area DPA includes an area where an image is displayed, and the non-display area NDA includes an area where an image is not displayed. The display area DPA may be referred to as an active area, and the non-display area NDA may be referred to as an inactive area. The display area DPA may generally occupy the center of the display device 10.

The display area DPA may include pixels PX. The pixels PX may be arranged in a matrix form. Each of the pixels PX may have a rectangular shape or a square shape in a plan view, but the shape thereof is not limited thereto. Each of the pixels PX may have a rhombus shape in which each side is inclined with respect to one direction. The respective pixels PX may be alternately arranged in a stripe type or a PenTile® type. Each of the pixels PX includes at least one light emitting element ED (referring to FIGS. 2 and 6) emitting light of a specific wavelength band to display a specific color.

The non-display area NDA may be disposed around the display area DPA. The non-display area NDA may entirely or partially surround the display area DPA. The display area DPA may have a rectangular shape, and the non-display area NDA may be disposed adjacent to four sides of the display area DPA. The non-display area NDA may constitute a bezel of the display device 10. Wirings or circuit drivers included in the display device 10 may be disposed in the non-display area NDA, or external devices may be mounted in the non-display area NDA.

Figure 2:
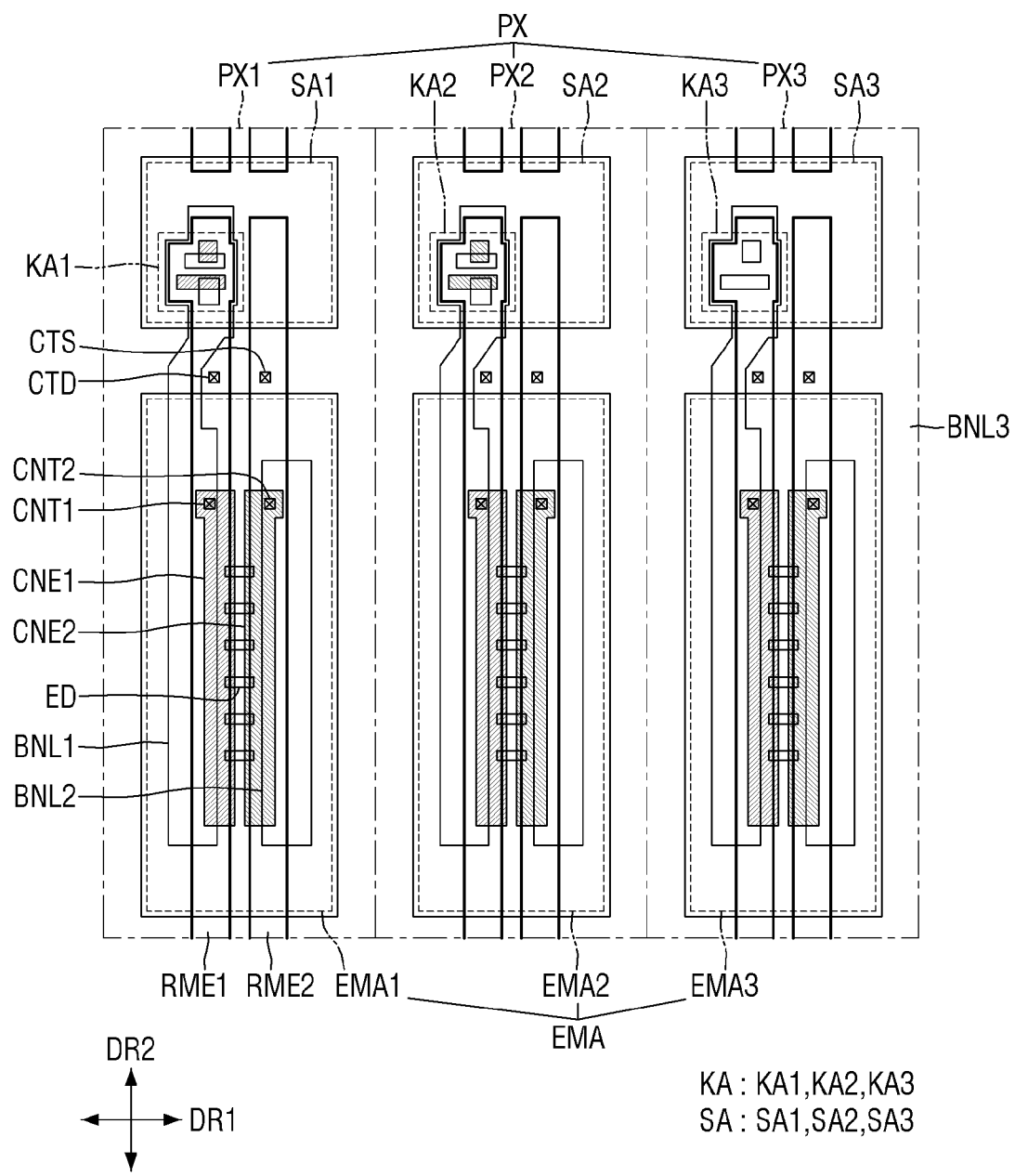
FIG. 2 is a schematic plan view illustrating one pixel of a display device according to an embodiment.

FIG. 2 is a schematic plan view illustrating one pixel of a display device according to an embodiment.

Referring to FIG. 2, each of pixels PX may include sub-pixels PXn (n is an integer of 1 to 3). For example, one pixel PX may include a first sub-pixel PX1, a second sub-pixel PX2, and a third sub-pixel PX3.

One pixel PX of the display device 10 may include light emitting areas EMA, and each of the sub-pixels PXn may include a light emitting area EMA and a non-light emitting area (not shown). The light emitting area EMA may include an area in which a light emitting element ED (referring to FIG. 6) is disposed to emit light of a specific wavelength band, and the non-light emitting area may correspond to an area in which no light emitting element ED is disposed and no light is emitted. The light emitting area EMA may include an area adjacent to the light emitting element ED to discharge light emitted from the light emitting element ED in addition to the area in which the light emitting element ED is disposed.

However, the light emitting area EMA may also include an area in which light emitted from the light emitting element ED is reflected or refracted by another member and emitted. The light emitting elements ED may be arranged in each of the sub-pixels PXn, and the light emitting area EMA may include an area in which the light emitting elements ED are arranged and an area adjacent to this area.

The first light emitting area EMA1 of the pixel PX is disposed in a first sub-pixel PX1, the second light emitting area EMA2 of the pixel PX is disposed in a second sub-pixel PX2, and the third light emitting area EMA3 of the pixel PX is disposed in a third sub-pixel PX3. The respective sub-pixels PXn may include different types of light emitting elements ED, and thus the first to third light emitting areas EMA may emit light of different colors. For example, the first sub-pixel PX1 may emit light of a first color, the second sub-pixel PX2 may emit light of a second color, and the third sub-pixel PX3 may emit light of a third color. The first color may be blue, the second color may be green, and the third color may be red. However, the colors of the first to third sub-pixels PX1, PX2 and PX3 are not limited thereto, and each of the sub-pixels PXn may include substantially the same light emitting element ED, and thus each of the light emitting areas EMA or one pixel PX may emit light of substantially the same color.

Further, each of the sub-pixels PXn of the pixel PX is a part of the non-light emitting area, and may include sub-areas SA arranged to be spaced apart from the light emitting area EMA. The sub-area SA may include a first sub-area SA1 of the first sub-pixel PX1, a second sub-area SA2 of the second sub-pixel PX2, and a third sub-area SA3 of the third sub-pixel PX3. The sub-area SA may be disposed at one side of the light emitting area EMA of each sub-pixel PXn in the second direction DR2, and may thus be disposed between the light emitting areas EMA of the sub-pixels PXn neighboring in the second direction DR2. For example, each of the sub-pixels PXn is disposed at the upper side of the sub-area SA, which is one side of the sub-area SA in the second direction DR2 with respect to the light emitting area EMA, and the light emitting areas EMA of the first to third sub-pixels PX1, PX2, and PX3 may be arranged substantially in parallel to each other in the first direction DR1. Similarly, the first sub-area SA1, the second sub-area SA2, and the third sub-area SA3 may be arranged substantially in parallel to each other in the first direction DR1.

Light is not emitted in the sub-area SA because the light emitting element ED is not disposed, but at least a portion of electrodes RME1 and RME2 disposed in each sub-pixel PXn may be disposed in the sub-area SA. At least a portion of the electrodes RME1 and RME2 disposed for each sub-pixel PXn may be disposed separately in the sub-area SA.

The display device 10 according to an embodiment may include a measurement area KA disposed in the sub-area SA of each sub-pixel PXn. A measurement pattern group KPG (referring to FIG. 7) including measurement patterns KP (referring to FIGS. 8 and 10) may be disposed in the measurement area KA. Each of the measurement patterns KP may correspond to electrodes and insulating layers arranged in the light emitting area EMA to be described later. When the electrodes and the insulating layers arranged in the light emitting area EMA are sequentially stacked in the manufacturing process of the display device 10, the measurement patterns KP are also formed together, so that the width of each layer overlapping another layer and the interval therebetween may be measured through the measurement pattern KP. Details of the measurement patterns KP arranged in the measurement area KA will be described later.

A third bank BNL3 may be disposed in a grid pattern over the entire display area DPA including portions extending in the first direction DR1 and the second direction DR2 in a plan view. The third bank BNL3 may be disposed across the boundary of each sub-pixel PXn to distinguish adjacent sub-pixels PXn. The third bank BNL3 is disposed so as to surround the light emitting area EMA and sub-area SA disposed for each sub-pixel PXn to distinguish the light emitting area EMA and the sub-area SA.

Figure 3:
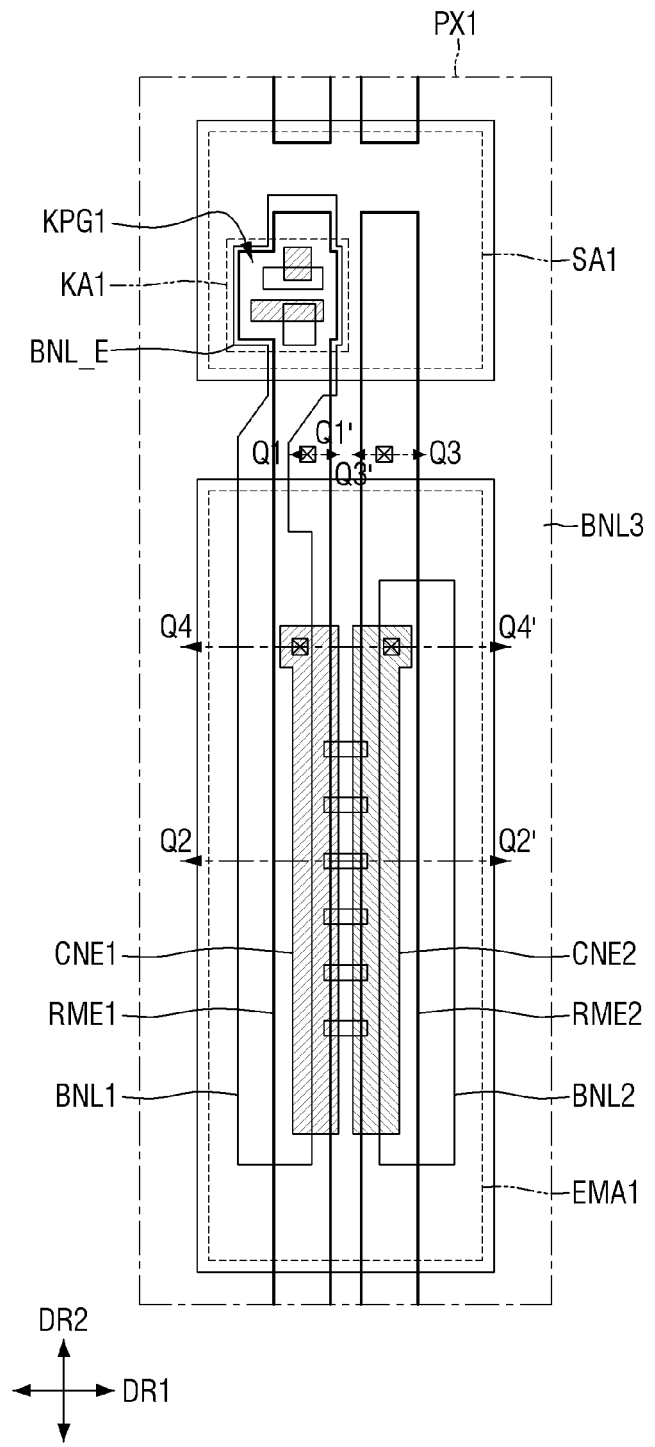
FIG. 3 is a plan view illustrating a first sub-pixel of FIG. 2.
Figure 4:
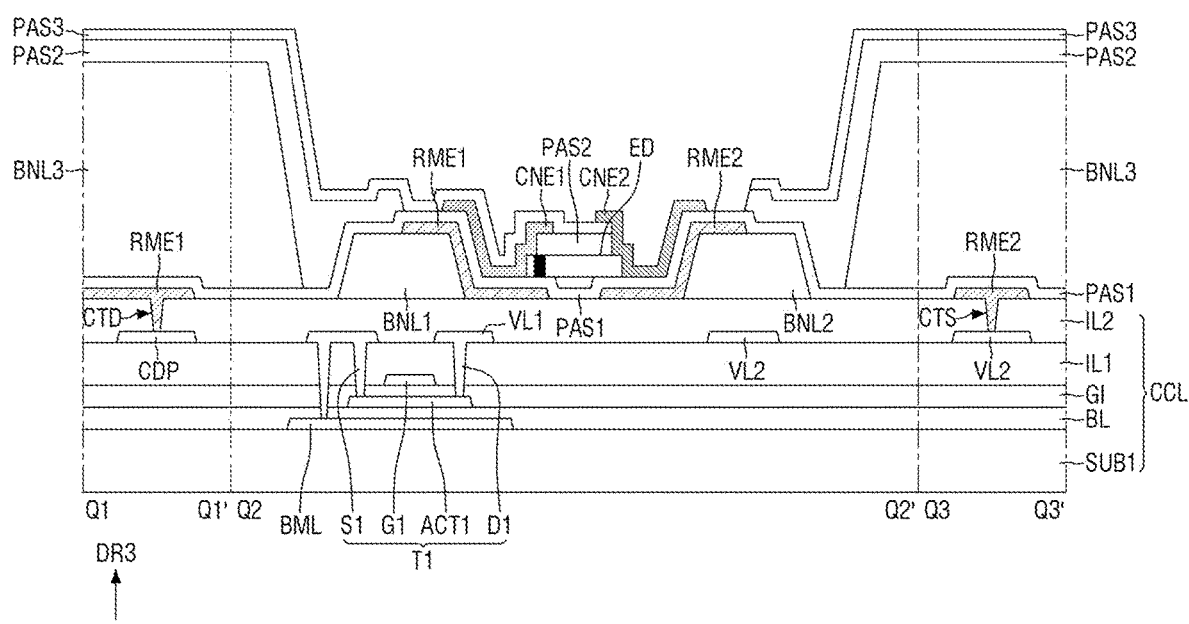
FIG. 4 is a schematic cross-sectional view taken along the lines Q1-Q1', Q2-Q2', and Q3-Q3' of FIG. 3.
Figure 5:
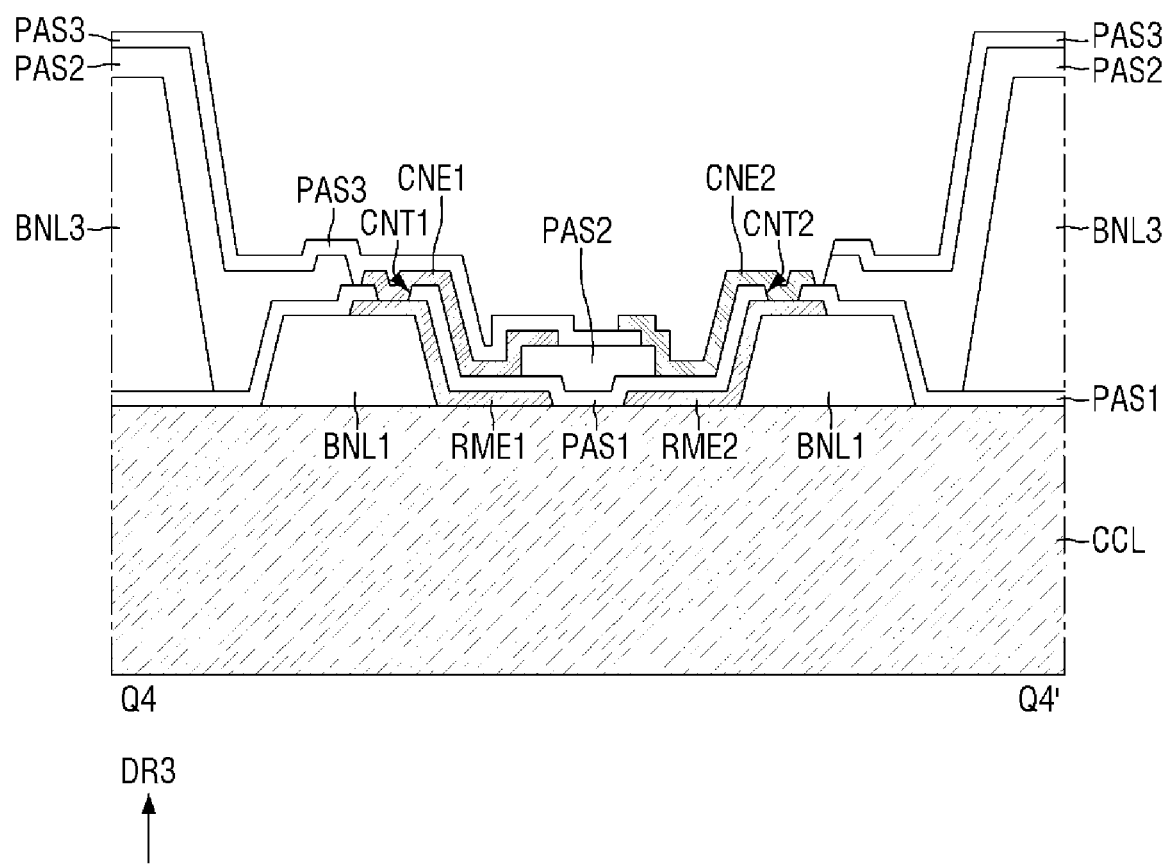
FIG. 5 is a schematic cross-sectional view taken along the line Q4-Q4' of FIG. 3.

FIG. 3 is a plan view illustrating a first sub-pixel of FIG. 2. FIG. 4 is a schematic cross-sectional view taken along the lines Q1-Q1', Q2-Q2', and Q3-Q3' of FIG. 3. FIG. 5 is a schematic cross-sectional view taken along the line Q4-Q4' of FIG. 3. FIG. 4 illustrates a cross-section across both ends of the light emitting element ED, and FIG. 5 illustrate a cross-section across contact holes CNT1 and CNT2 through which contact electrodes CNE1 and CNE2 contact first and second electrodes RME1 and RME2, respectively.

Referring to FIGS. 3 to 5 together with FIG. 2, the display device 10 may include a first substrate SUB1, and a circuit layer CCL and a display element layer which are disposed on the first substrate SUB1. The display element layer includes a light emitting element ED, and is provided with first and second electrodes RME1 and RME2 and contact electrodes CNE1 and CNE2. The circuit layer CCL includes circuit elements for driving the light emitting element ED, and is provided with lines.

Specifically explaining the circuit layer CCL and the display element layer, the first substrate SUB1 may correspond to an insulating substrate, and may include an insulating material such as glass, quartz, or polymer resin. The first substrate SUB1 may include a rigid substrate, but may also include a flexible substrate capable of bending, folding, rolling, or the like.

A first conductive layer may be disposed on the first substrate SUB1. The first conductive layer may include a lower metal layer BML, and the lower metal layer BML is disposed to overlap a first active layer ACT1 of a first transistor T1 to be described later. The lower metal layer BML may include a light-blocking material to prevent light from being incident on the first active layer ACT1 of the first transistor T1. For example, the lower metal layer BML may include an opaque metal material that prevents light transmission. However, the material of the lower metal layer BML is not limited thereto, and in an embodiment, the lower metal layer BML may be omitted.

A buffer layer BL may cover the first conductive layer, and may be entirely disposed on the first substrate SUB1. The buffer layer BL may be formed on the first substrate SUB1 to protect the first transistors T1 from moisture penetrating through the first substrate SUB1 which is vulnerable to moisture permeation, and may perform a surface planarization function.

A semiconductor layer may be disposed on the buffer layer BL. The semiconductor layer may include the first active layer ACT1 of the first transistor T1. In an embodiment, the semiconductor layer may include polycrystalline silicon, monocrystalline silicon, or oxide semiconductor. Polycrystalline silicon may be formed by crystallizing amorphous silicon. When the semiconductor layer includes an oxide semiconductor, the first active layer ACT1 may include conducting regions and a channel region therebetween. The oxide semiconductor may contain indium (In). For example, the oxide semiconductor may include at least one of indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), and indium-gallium-zinc-tin oxide (IGZTO).

In another embodiment, the semiconductor layer may include polycrystalline silicon. Polycrystalline silicon may be formed by crystallizing amorphous silicon, and in this case, the conducting regions of the first active layer ACT1 may include doped regions doped with impurities, respectively. However, the embodiments are not limited thereto.

A first gate insulating layer G1 may be disposed on the semiconductor layer and the buffer layer BL. For example, the first gate insulating layer G1 may be disposed to cover the upper surfaces of the semiconductor layer and the buffer layer BL. The first gate insulating layer G1 may function as a gate insulating film of each transistor.

A second conductive layer may be disposed on the first gate insulating layer G1. The second conductive layer may include a first gate electrode G1 of the first transistor T1. Although not shown in the drawings, the second conductive layer may further include scan lines electrically connected to each sub-pixel PXn, and a first capacitive electrode of a storage capacitor. The first gate electrode G1 of the second conductive layer may be disposed to partially overlap the first active layer ACT1 of the first transistor T1.

A first interlayer insulating layer IL1 may be disposed on the second conductive layer. The first interlayer insulating layer IL1 may be disposed to cover the second conductive layer to perform a function of protecting the second conductive layer.

A third conductive layer may be disposed on the first interlayer insulating layer IL1. The third conductive layer may include a first source electrode S1 and a first drain electrode D1 of the first transistor T1, a first voltage line VL1, a second voltage line VL2, and a first conductive pattern CDP. Although not shown in the drawings, the third conductive layer may further include data lines electrically connected to each sub-pixel PXn, and a second capacitive electrode of a storage capacitor.

The first source electrode S1 and first drain electrode D1 of the first transistor T1 are disposed to partially overlap the first active layer ACT1. Each of the first source electrode S1 and the first drain electrode D1 may contact the first active layer ACT1 through a contact hole penetrating the first interlayer insulating layer IL1 and the first gate insulating layer G1. The first source electrode S1 may contact the lower metal layer BML through a contact hole penetrating the first interlayer insulating layer IL1, the first gate insulating layer G1, and the buffer layer BL. The first drain electrode D1 may be electrically connected to the first voltage line VL1, and the first source electrode S1 may be electrically connected to the first conductive pattern CDP that is electrically connected to the first electrode RME1. For example, the first drain electrode D1 may be integral with a part of the first voltage line VL1, and a part of the first voltage line VL1 may be in contact with the first active layer ACT1 to serve as the first drain electrode D1. However, the first drain electrode D1 is not limited thereto, and the first drain electrode D1 may be electrically connected to the first voltage line VL1 through another conductive pattern.

A high-potential voltage (or a first power voltage) supplied to the first transistor T1 may be applied to the first voltage line VL1, and a low-potential voltage (or a second power voltage) supplied to the second electrode RME2 may be applied to the second voltage line VL2.

The first voltage line VL1 and the second voltage line VL2 may be disposed to extend in the second direction DR2. The first voltage line VL1 and the second voltage line VL2 may be disposed at a position partially overlapping the first and second electrodes RME1 and RME2 to be described later in a thickness direction. The first voltage line VL1 and the second voltage line VL2 may be disposed to cross the light emitting area EMA.

The first conductive pattern CDP may be electrically connected to the first source electrode S1. The first conductive pattern CDP may also contact the first electrode RME1 to be described later, and the first transistor T1 may transmit a first power voltage applied from the first voltage line VL1 to the first electrode RME1 through the first conductive pattern CDP. Although it is shown in the drawings that the third conductive layer includes one first voltage line VL1 and one second voltage line VL2, the embodiments are not limited thereto. The third conductive layer may include a larger number of first voltage lines VL1 and a larger number of second voltage lines VL2.

A second interlayer insulating layer IL2 may be disposed on the third conductive layer. The second interlayer insulating layer IL2 may function as an insulating film between the third conductive layer and other layers disposed thereon. The second interlayer insulating layer IL2 may cover the third conductive layer and protect the third conductive layer. The second interlayer insulating layer IL2 may perform a surface planarization function.

Each of the first to third conductive layers may include a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the embodiments are not limited thereto.

Each of the buffer layer BL, the first gate insulating layer G1, the first interlayer insulating layer IL1, and the second interlayer insulating layer IL2 may include a single layer or inorganic layers alternately stacked. For example, each of the buffer layer BL, the first gate insulating layer G1, the first interlayer insulating layer IL1, and the second interlayer insulating layer IL2 may be formed as multiple layers in which inorganic layers each including at least one of silicon oxide (SiOx), silicon nitride (SiNx), and silicon oxynitride (SiOxNy) are alternately stacked, or as multiple layers in which silicon oxide (SiOx) and silicon nitride (SiNx) are sequentially stacked.

A first bank BNL1, a second bank BNL2, electrodes RME1 and RME2, a light emitting element ED, a third bank BNL3, and contact electrodes CNE1 and CNE2 are arranged on the second interlayer insulating layer IL2. Insulating layers PAS1, PAS2, and PAS3 may be further arranged on the second interlayer insulating layer IL2.

The first bank BNL1 and the second bank BNL2 may be directly disposed on the second interlayer insulating layer IL2. A part of the first bank BNL1 and a part of the second bank BNL2 may be disposed in the light emitting area EMA of each sub-pixel PXn to be spaced apart from each other. For example, the first bank BNL1 may be disposed at the left side from the center of the light emitting area EMA, and the second bank BNL2 may be disposed at the right side from the center of the light emitting area EMA.

The first bank BNL1 may extend in the second direction DR2 from the light emitting area EMA to be partially disposed even in the sub-area SA. In an embodiment, the first bank BNL1 may include a bank extension portion BNL_E that is disposed in the sub-area SA and has a large width. A first electrode extension portion CE1 of the first electrode RME1, which will be described later, may be disposed on the bank extension portion BNL_E of the first bank BNL1, and the measurement pattern group KPG may be disposed on the first electrode extension portion CE1 to form a measurement area KA.

In contrast, unlike the first bank BNL1, the second bank BNL2 may have a shape extending in the second direction DR2 within the light emitting area EMA, and the length of the second bank BNL2 may be shorter than the length of an opening area surrounded by the third bank BNL3 in the second direction DR2. The first bank BNL1 and the second bank BNL2 may form an island-shaped pattern extending in one direction from the front surface of the display area DPA.

Each of the first bank BNL1 and the second bank BNL2 may have a structure in which at least a part thereof protrudes from the upper surface of the second interlayer insulating layer IL2. The first bank BNL1 and the second bank BNL2 may divide an area therebetween and an outer area of the area on the second interlayer insulating layer IL2, and light emitting elements ED may be arranged therebetween. The protrusion portion of each of the first bank BNL1 and the second bank BNL2 may have an inclined side surface, and light emitted from the light emitting element ED may be reflected from the electrodes RME1 and RNE2 disposed on the first bank BNL1 and the second bank BNL2 and emitted in the upward direction of the first substrate SUB1. Each of the first bank BNL1 and the second bank BNL2 may provide an area in which the light emitting element ED is disposed, and may function as a reflective barrier that reflects light emitted from the light emitting element ED in an upward direction. The side surface of each of the first bank BNL1 and the second bank BNL2 may be inclined in a linear shape, but is not limited thereto, and the outer surface of each of the first bank BNL1 and the second bank BNL2 may have a curved semi-circle or semi-ellipse shape. Each of the first bank BNL1 and the second bank BNL2 may include an organic insulating material such as polyimide (PI), but the material thereof is not limited thereto.

The electrodes RME1 and RME2 may have a shape extending in one direction. The first and second electrodes RME1 and RME2 may be spaced apart from each other, and disposed for each sub-pixel PXn. For example, the first electrode RME1 and the second electrode RME2 may be disposed in one sub-pixel PXn, extend in the second direction DR2, and spaced apart from each other in the first direction DR1. The first electrode RME1 may be partially disposed on the first bank BNL1, and the second electrode RME2 may be partially disposed on the second bank BNL2. Each of the first and second electrodes RME1 and RME2 may be disposed to be placed on one side surface of the first bank BNL1 or the second bank BNL2. Although it is illustrated in the drawings that the first electrode RME1 and the second electrode RME2 have substantially uniform widths in the light emitting area EMA, the widths of the first electrode RME1 and the second electrode RME2 are not limited thereto. In an embodiment, each of the electrodes RME1 and RME2 may have a portion disposed on the first bank BNL1 or the second bank BNL2 having a relatively larger width than other portions.

The first electrode RME1 may be disposed on one side surface of side surfaces of the first bank BNL1 to face the second bank BNL2. A portion of the first electrode RME1 may be disposed on a portion of the first bank BNL1, disposed in the light emitting area EMA, and another portion of the first electrode RME1 may be disposed directly on the second interlayer insulating layer IL2. The first electrode RME1 may extend in the second direction DR2 to be disposed beyond the light emitting area EMA, and may be separated from the first electrode RME1 of another pixel PX neighboring in the second direction DR2 in the sub-area SA. The first electrode RME1 may extend in the second direction DR2 to be disposed over at least two pixels PX, and thus the first electrode RME1 may be partially removed in the sub-area SA, to be separated for each sub-pixel PXn. Thus, the first electrode RME1 may be partially disposed even at a boundary with another pixel PX neighboring in the second direction DR2.

The first electrode RME1 extends in the second direction DR2 to overlap the third bank BNL3 between the light emitting area EMA and the sub-area SA. The first electrode RME1 may contact the first conductive pattern CDP of the third conductive layer through a first electrode contact hole CTD penetrating the second interlayer insulating layer IL2 at the portion overlapping the third bank BNL3. The first electrode RME1 may be electrically connected to the first transistor T1 through the first conductive pattern CDP to apply a first power voltage. Since the first electrode RME1 is separated for each pixel PX and for each sub-pixel PXn, the light emitting elements ED of different sub-pixels PXn may emit light individually.

According to an embodiment, the first electrode RME1 may include a first electrode extension portion CE1 disposed in the sub-area SA, and the first electrode extension portion CE1 may be disposed on the bank extension portion BNL_E of the first bank BNL1. The first electrode extension portion CE1 may be flatly disposed because it has a smaller width than the bank extension portion BNL_E. A measurement pattern group KPG including measurement patterns KP may be disposed on the first electrode extension portion CE1, and the first electrode extension portion CE1 may be disposed in the measurement area KA in the sub area SA.

The second electrode RME2 may have substantially the same shape as the first electrode RME1 except for the first electrode extension portion CE1. The second electrode RME2 may be disposed on one side surface of side surfaces of the second bank BNL2 to face the first bank BNL1. A portion of the second electrode RME2 may be disposed on a portion of the second bank BNL2, disposed in the light emitting area EMA, and another portion of the second electrode RME2 may be disposed directly on the second interlayer insulating layer IL2. The second electrode RME2 may extend in the second direction DR2 to be disposed beyond the light emitting area EMA, and may be separated from the second electrode RME2 of another pixel PX neighboring in the second direction DR2 in the sub-area SA. The second electrode RME2 may extend in the second direction DR2 to be disposed over at least two pixels PX, and thus the second electrode RME2 may be partially removed in the sub-area SA, to be separated for each sub-pixel PXn. Thus, the second electrode RME2 may be partially disposed even at a boundary with another pixel PX neighboring in the second direction DR2.

The second electrode RME2 extends in the second direction DR2 to overlap the third bank BNL3 between the light emitting area EMA and the sub-area SA. The second electrode RME2 may contact the second voltage line VL2 of the third conductive layer through a second electrode contact hole CTS penetrating the second interlayer insulating layer IL2 at the portion overlapping the third bank BNL3. The second electrode RME2 may be electrically connected to the second voltage line VL2 to apply a second power voltage.

Although it is illustrated in the drawings that first and second electrodes RME1 and RME2 are arranged for each sub-pixel PXn, the arrangement of the first and second electrodes RME1 and RME2 is not limited thereto, and the positions of the first and second electrodes RME1 and RME2 disposed in each sub-pixel PXn may be changed depending on the number thereof or the number of light emitting elements ED disposed in each sub-pixel PXn.

Each of the first and second electrodes RME1 and RME2 may include a conductive material having high reflectance. For example, each of the first and second electrodes RME1 and RME2 may include a metal such as silver (Ag), copper (Cu), or aluminum (Al) as the conductive material having high reflectance, or may include an alloy containing aluminum (Al), nickel (Ni), or lanthanum (La). Each of the first and second electrodes RME1 and RME2 may reflect the light emitted from the light emitting element ED and proceeding to the inclined side surfaces of the first bank BNL1 and the second bank BNL2 in the upward direction of each sub-pixel PXn.

The materials of the first and second electrodes RME1 and RME2 are not limited thereto, and each of the first and second electrodes RME1 and RME2 may further include a transparent conductive material. For example, each of the first and second electrodes RME1 and RME2 may include a material such as indium tin oxide (ITO), indium zinc oxide (IZO), or indium tin zinc Oxide (ITZO). In some embodiments, each of the first and second electrodes RME1 and RME2 may have a structure in which one or more transparent conductive material layers and one or more metal layers having high reflectivity are stacked, or may be formed as one layer including transparent conductive material layers and metal layers having high reflectivity. For example, each of the first and second electrodes RME1 and RME2 may have a stacked structure of ITO/Ag/ITO/, ITO/Ag/IZO, or ITO/Ag/ITZO/IZO.

The first insulating layer PAS1 may be entirely disposed on the second interlayer insulating layer IL2. For example, the first insulating layer PAS1 may be disposed to cover the electrodes RME1 and RME2, the first banks BNL1 and the second banks BNL2. In an embodiment, the first insulating layer PAS1 may include contact holes CNT1 and CNT2 exposing parts of the upper surfaces of the electrodes RME1 and RME2, and the contact electrodes CNE1 and CNE2 to be described later may contact the exposed electrodes RME1 and RME2 through the contact holes CNT1 and CNT2.

In an embodiment, a step may be formed in the first insulating layer PAS1 such that a part of the upper surface of the first insulating layer PAS1 is recessed between the first and second electrodes RME1 and RME2 spaced apart from each other in the first direction DR1. As the first insulating layer PAS1 covers the first and second electrodes RME1 and RME2, the first insulating layer PAS1 may be stepped therebetween. The first insulating layer PAS1 may protect the first and second electrodes RME1 and RME2 and insulate the first and second electrodes RME1 and RME2 from each other. The first insulating layer PAS1 may prevent the light emitting element ED disposed on the first insulating layer PAS1 from being damaged by direct contact with other members.

A third bank BNL3 may be disposed on the first insulating layer PAS1. The third bank BNL3 may be disposed in a lattice pattern while including portions extending in the first direction DR1 and the second direction DR2 in a plan view. The third bank BNL3 may be disposed over the boundary of the respective sub-pixels PXn to distinguish neighboring sub-pixels PXn. The third bank BNL3 may be disposed to surround the light emitting area EMA and the sub-area SA disposed for each sub-pixel PXn to distinguish the light emitting area EMA and the sub-area SA. In the portion of the third bank BNL3 extending in the second direction DR2, the portion disposed between the light emitting areas EMA may substantially the same width as the portion disposed between the sub-areas SA. Accordingly, the distance between the sub-areas SA may be substantially the same as the distance between the light emitting areas EMA. However, the embodiments are not limited thereto. The third bank BNL3 may be disposed so as to partially overlap the first and second electrodes RME1 and RME2 under the third bank BNL3 in the thickness direction. For example, the third bank BNL3 may overlap the first and second electrodes RME1 and RME2 in a portion surrounding the sub-area SA.

The third bank BNL3 may have a greater height than the first bank BNL1 and the second bank BNL2. The third bank BNL3 may prevent ink from overflowing to adjacent sub-pixels PXn in an inkjet printing process of the process of manufacturing the display device 10, so that inks in which different light emitting elements ED are dispersed for each pixel PXn may be separated from each other not to be mixed with each other. A portion of the third bank BNL3 extending in the first direction DR1 may be partially disposed on the first bank BNL1. The third bank BNL3, like the first bank BNL1, may include polyimide (PI), but the material thereof is not limited thereto.

The light emitting element ED may be disposed on the first insulating layer PAS1. The light emitting elements ED may be arranged to be spaced apart from each other along the second direction DR2 in which the first and second electrodes RME1 and RME2 extend, and may be aligned substantially in parallel to each other. The light emitting element ED may have a shape extending in one direction, and a direction in which each of the first and second electrodes RME1 and RME2 extends may be substantially perpendicular to a direction in which the light emitting element ED extends. However, the embodiments are not limited thereto, and the light emitting element ED may be disposed obliquely in a direction in which each of the first and second electrodes RME1 and RME2 extends.

The light emitting element ED may include semiconductor layers doped with different conductivity types of dopants. The light emitting element ED may include semiconductor layers, and may be aligned such that one end of the light emitting element ED faces a specific direction according to the direction of an electric field generated on the first and second electrodes RME1 and RME2. The light emitting element ED may include a light emitting layer 36 (referring to FIG. 6) to emit light of a specific wavelength band. The light emitting elements ED disposed in each sub-pixel PXn may emit light of different wavelength bands according to the material constituting the light emitting layer 36. However, the embodiments are not limited thereto, and the light emitting elements ED disposed in each of the sub-pixels PXn may emit light of substantially the same color.

The light emitting element ED may be provided with multiple layers in a direction substantially parallel to the upper surface of the first substrate SUB1. The light emitting element ED of the display device 10 is disposed such that one extending direction is substantially parallel to the upper surface of the first substrate SUB1, and the semiconductor layers included in the light emitting element ED may be sequentially arranged along a direction substantially parallel to the upper surface of the first substrate SUB1. However, the embodiments are not limited thereto. In some embodiments, when the light emitting element ED has a different structure, the semiconductor layers may be arranged in a direction substantially perpendicular to the upper surface of the first substrate SUB1.

The light emitting element ED may be disposed on each of the first and second electrodes RME1 and RME2 between the first bank BNL1 and the second bank BNL2. The elongated length of the light emitting element ED may be longer than the distance between the first and second electrodes RME1 and RME2, and first and second ends of the light emitting element ED may be disposed on the first and second electrodes RME1 and RME2, respectively. The light emitting element ED may include semiconductor layers, and a first end and a second end opposite to the first end may be defined based on any one semiconductor layer. The light emitting element ED may be disposed such that the first end and the second end are respectively placed on specific one of the first and second electrodes RME1 and RME2. For example, the light emitting element ED may be disposed such that the first end is placed on the first electrode RME1 and the second end is placed on the second electrode RME2. The first end of the light emitting element ED may be electrically connected to the first electrode RME1, and the second end thereof may be electrically connected to the second electrode RME2. However, the arrangement of the light emitting element ED is not limited thereto, and at least some of the light emitting elements ED may be arranged such that the first end is placed on the second electrode RME2 and the second end is placed on the first electrode RME1.

The first and second ends of the light emitting element ED may contact the contact electrodes CNE1 and CNE2, respectively. Since the light emitting element ED may not be provided with an insulating film 38 (referring to FIG. 6) on the end surface in one direction, and a part of the semiconductor layer may be exposed, the exposed semiconductor layer may contact the contact electrodes CNE1 and CNE2. However, the embodiments are not limited thereto. In some embodiments, at least a part of the insulating film 38 may be removed, so that side surfaces of the semiconductor layers may be partially exposed. The exposed side surfaces of the semiconductor layers may directly contact the contact electrodes CNE1 and CNE2. The light emitting elements ED may be electrically connected to the first and second electrodes RME1 and RME2 through the contact electrodes CNE1 and CNE2, respectively.

A second insulating layer PAS2 may be partially disposed on the first insulating layer PAS1 and the light emitting element ED. The second insulating layer PAS2 may also be disposed in the third bank BNL3 and the sub-area SA. For example, the second insulating layer PAS2 may partially surround the outer surface of the light emitting element ED not to cover one end and another end of the light emitting element ED. A part of the second insulating layer PAS2 may overlap the second bank BNL2 and may be disposed on the first insulating layer PAS1. Thus, the second insulating layer PAS2 may be disposed on the light emitting element ED, the first insulating layer PAS1, and the third bank BNL3 in the light emitting area EMA, and may be disposed to expose a part of the portion where the first and second electrodes RME1 and RME2 are disposed together with first and second ends of the light emitting element ED. The shape of the second insulating layer PAS2 may be formed by a process of entirely placing the second insulating layer PAS2 on the first insulating layer PAS1 and the third bank BNL3 and removing the second insulating layer PAS2 to expose both ends of the light emitting element ED during the process of manufacturing the display device 10.

A portion of the second insulating layer PAS2, the portion being disposed on the light emitting element ED, may extend in the second direction DR2 on the first insulating layer PAS1 in a plan view, thereby forming a linear or island-shaped pattern in each sub-pixel PXn. The second insulating layer PAS2 may protect the light emitting element ED and fix the light emitting element ED in the process of manufacturing the display device 10. The second insulating layer PAS2 may be disposed to fill the space between the light emitting element ED and the first insulating layer PAS1 under the light emitting element ED.

The contact electrodes CNE1 and CNE2 and the third insulating layer PAS3 may be disposed on the second insulating layer PAS2. The contact electrodes CNE1 and CNE2 may include a first contact electrode CNE1 and a second contact electrode CNE2, which are disposed on different layers. The third insulating layer PAS3 may be disposed between the first contact electrode CNE1 and the second contact electrode CNE2.

Each of the contact electrodes CNE1 and CNE2 may contact the light emitting element ED and the first and second electrodes RME1 and RME2. The contact electrodes CNE1 and CNE2 may directly contact the semiconductor layer exposed to end surfaces of the light emitting element ED, and may contact the exposed upper surface on which the first insulating layer PAS1 is not disposed, among the upper surfaces of the first and second electrodes RME1 and RME2. First and second ends of the light emitting element ED may be electrically connected to the first and second electrodes RME1 and RME2 through the first and second contact electrodes CNE1 and CNE2.

For example, the first contact electrode CNE1 may be disposed on the first electrode RME1, and the second contact electrode CNE2 may be disposed on the second electrode RME2. The first contact electrode CNE1 may contact the first end of the light emitting element ED and the first electrode RME1, and the second contact electrode CNE2 may contact the second end of the light emitting element ED and the second electrode RME2.

The first contact electrode CNE1 may have a narrower width than the first electrode RME1 and may have a shape extending in the second direction DR2. The first contact electrode CNE1 may contact the first electrode RME1 through the first contact hole CNT1 that penetrates the first insulating layer PAS1 to expose the first electrode RME1. The first contact hole CNT1 may be disposed so as not to overlap the light emitting elements ED in the first direction DR1. For example, the first contact hole CNT1 may be disposed adjacent to one side of an area in which the light emitting elements ED are arranged, in the second direction DR2. However, the position of the first contact hole CNT1 is not limited thereto, and may be variously changed according to the positions of the light emitting elements ED and the structures of the electrodes RME1 and RME2. The light emitting element ED emits light from the first and second ends thereof, and the first contact hole CNT1 may be positioned so as to deviate from a path of light, thereby increasing light emission efficiency.

The first contact electrode CNE1 may be directly disposed on the second insulating layer PAS2. The first contact electrode CNE1 may form a linear pattern extending in the second direction DR2 in the light emitting area EMA. However, the embodiments are not limited thereto.

A third insulating layer PAS3 may be disposed on the first contact electrode CNE1. The third insulating layer PAS3 may cover the first contact electrode CNE1, and a part of the third insulating layer PAS3 may be disposed on the second insulating layer PAS2. In some embodiments, the third insulating layer PAS3 may be entirely disposed on the first insulating layer PAS1 except for a portion where the second contact electrode CNE2 is disposed on the electrodes RME1 and RME2. The third insulating layer PAS3 may insulate the first contact electrode CNE1 and the second contact electrode CNE2 from each other such that the first contact electrode CNE1 and the second contact electrode CNE2 are not in direct contact with each other. In some embodiments, the third insulating layer PAS3 may be omitted. In this case, the first contact electrode CNE1 and the second contact electrode CNE2 may be disposed on a same layer.

The second contact electrode CNE2 may have a narrower width than the second electrode RME2 and may have a shape extending in the second direction DR2. The second contact electrode CNE2 may contact the second electrode RME2 through the second contact hole CNT2 that penetrates the first insulating layer PAS1 to expose the second electrode RME2. The second contact hole CNT2 may also be disposed so as not to overlap the light emitting elements ED in the first direction DR1. The second contact electrode CNE2 may be directly disposed on the third insulating layer PAS3. The second contact electrode CNE2 may form a linear pattern extending in the second direction DR2 in the light emitting area EMA. However, the embodiments are not limited thereto.

The contact electrodes CNE1 and CNE2 may include a conductive material. For example, the contact electrodes CNE1 and CNE2 may include ITO, IZO, ITZO, or aluminum (Al). For example, the contact electrodes CNE1 and CNE2 may include a transparent conductive material, and the light emitted from the light emitting element ED may pass through the contact electrodes CNE1 and CNE2 and proceed toward the electrodes RME1 and RME2. However, the embodiments are not limited thereto.

Although not shown in the drawings, another insulating layer may be further disposed on the contact electrodes CNE1 and CNE2 and the third insulating layer PAS3 to cover the contact electrodes CNE1 and CNE2 and the third insulating layer PAS3. This insulating layer may be entirely disposed on the first substrate SUB1 to protect members disposed thereon from external environments.

Each of the above-described first insulating layer PAS1, second insulating layer PAS2, and third insulating layer PAS3 may include an inorganic insulating material or an organic insulating material. In an embodiment, each of the first insulating layer PAS1, the second insulating layer PAS2, and the third insulating layer PAS3 may include an inorganic insulating layer such as silicon oxide (SiOx), silicon nitride (SiNx), silicon oxynitride (SiOxNy), aluminum oxide ($Al_2O_3$), or aluminum nitride (AlN). In other embodiments, each of the first insulating layer PAS1, the second insulating layer PAS2, and the third insulating layer PAS3 may include an organic insulating layer such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. The materials of the first to third insulating layers PAS1, PAS2 and PAS3 are not limited thereto.

Figure 6:
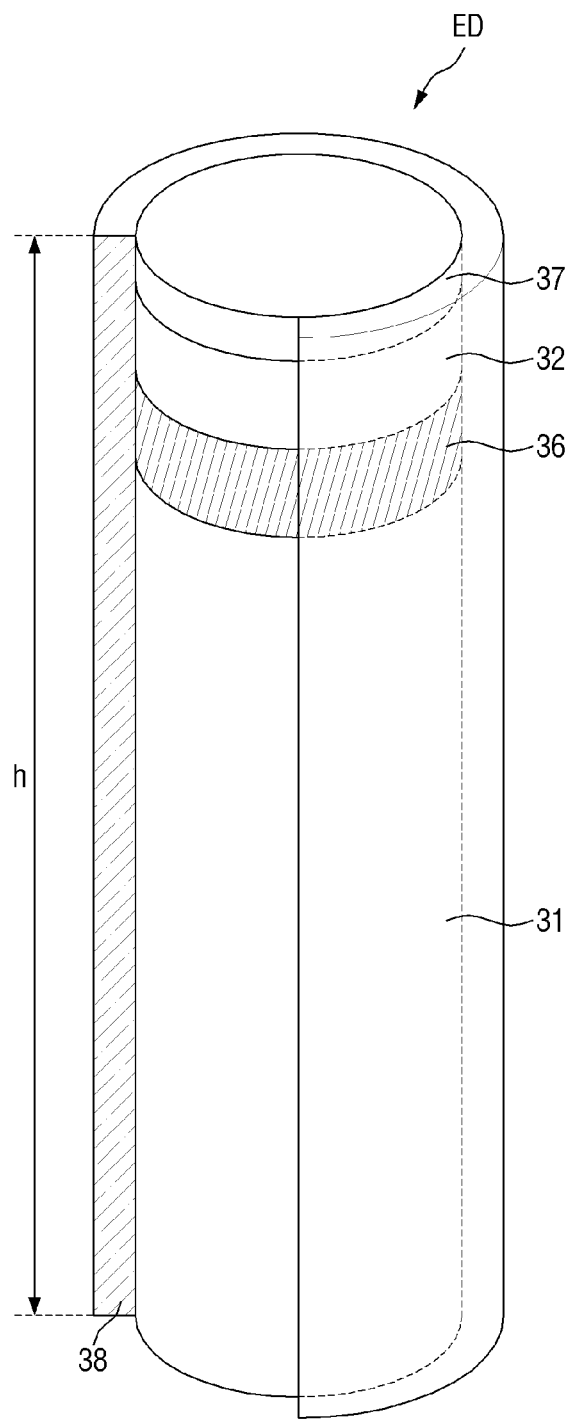
FIG. 6 is a schematic view of a light emitting element according to an embodiment.

FIG. 6 is a schematic view of a light emitting element according to an embodiment.

The light emitting element ED may be a light emitting diode. Specifically, the light emitting element ED may be an inorganic light emitting diode having a size of a micrometer or a nanometer and made of an inorganic material. When an electric field is formed between two electrodes facing each other in a direction, the organic light emitting diode may be aligned between the two electrodes having polarity. The light emitting element ED may be aligned between the two electrodes by the electric field formed on the two electrodes.

The light emitting element ED according to an embodiment may have a shape extending in one direction. The light emitting element ED may have a shape of a rod, a wire, or a tube. In an embodiment, the light emitting element ED may have a shape of a cylinder or road. However, the shape of the light emitting element ED is not limited thereto, and the light emitting element ED may have various shapes such as a cube, a cuboid, and a hexagonal column, or may have a shape extending in one direction and having partially inclined outer surface. Semiconductors included in the light emitting element ED to be described later may be sequentially arranged or stacked in one direction.

The light emitting element ED may include semiconductor layers doped with any conductive type (for example, p-type or n-type) impurity. The semiconductor layers may receive an electrical signal applied from an external power source and emit light of a specific wavelength band.

Referring to FIG. 6, the light emitting element ED may include a first semiconductor layer 31, a second semiconductor layer 32, a light emitting layer 36, an electrode layer 37, and an insulating film 38.

The first semiconductor layer 31 may be an n-type semiconductor layer. For example, when the light emitting element ED emits light of a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material may include at least one of AlGaInN, GaN, AlGaN, InGaN, AlN, and InN, each being doped with n-type impurities. The first semiconductor layer 31 may be doped with an n-type dopant. For example, the n-type dopant may include Si, Ge, or Sn. In an embodiment, the first semiconductor layer 31 may include n-GaN doped with n-type Si. The length of the first semiconductor layer 31 may be in a range of about 1.5 μm to about 5 μm, but is not limited thereto.

The second semiconductor layer 32 is disposed on the light emitting layer 36 to be described later. The second semiconductor layer 32 may be a p-type semiconductor layer. When the light emitting element ED emits light of a blue wavelength band or a green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material may include at least one of AlGaInN, GaN, AlGaN, InGaN, AlN, and InN, each being doped with p-type impurities. The second semiconductor layer 32 may be doped with a p-type dopant. For example, the p-type dopant may include Mg, Zn, Ca, Se, or Ba. In an embodiment, the second conductive semiconductor 320 may include p-GaN doped with p-type Mg. The length of the second semiconductor layer 32 may be in a range of about 0.05 μm to about 0.10 μm, but is not limited thereto.

Although it is shown in FIG. 4 that each of the first semiconductor layer 31 and the second semiconductor layer 32 is formed as one layer, the embodiment are not limited thereto. According to some embodiments, each of the first semiconductor layer 31 and the second semiconductor layer 32 may further include a larger number of layers, for example, clad layers or tensile strain barrier reducing (TSBR) layers according to the material of the light emitting layer 36.

The light emitting layer 36 may be disposed between the first semiconductor layer 31 and the second semiconductor layer 32. The light emitting layer 36 may include a material of a single or multiple quantum well structure. When the light emitting layer 36 includes a material of a multiple quantum well structure, the light emitting layer 36 may have a structure in which quantum layers and well layers are alternately stacked. The light emitting layer 36 may emit light by the combination of electron-hole pairs according to an electrical signal applied through the first semiconductor layer 31 and the second semiconductor layer 32. For example, when the light emitting layer 36 emits light of a blue wavelength band, the light emitting layer 36 may include a material such as AlGaN or AlGaInN. In particular, when the light emitting layer 36 has a multiple quantum well structure in which quantum layers and well layers are alternately stacked, the quantum wells may include a material such as AlGaN or AlGaInN, and the well layers may include a material such as GaN or AlInN. In an embodiment, the light emitting layer 36 includes quantum wells each containing AlGaInN and well layers each containing AlInN, and thus the light emitting layer 36 may emit blue light having a central wavelength band of about 450 nm to about 495 nm.

However, the structure of the light emitting layer 36 is not limited thereto, and the light emitting layer 36 may have a structure in which semiconductor materials having high bandgap energy and semiconductor materials having low bandgap energy are alternately stacked, and may include other group 3 to group 5 semiconductor materials depending on the wavelength bad of light. The light emitted from the light emitting layer 36 is not limited to light of a blue wavelength band, and in some cases, the light emitting layer 36 may emit light of a red or green wavelength band. The length of the light emitting layer 36 may be in a range of about 0.05 μm to about 0.10 μm, but is not limited thereto.

The light emitted from the light emitting layer 36 may be emitted to side surfaces of the light emitting element ED as well as the longitudinal outer surface of the light emitting element ED. The direction of the light emitted from the light emitting layer 36 is not limited to one direction.

The electrode layer 37 may include an ohmic contact electrode. However, the electrode layer 37 is not limited thereto, and the electrode layer 37 may include a Schottky contact electrode. The light emitting element ED may include at least one electrode layer 37. Although it is shown in FIG. 6 that the light emitting element ED includes one electrode layer 37, the embodiments are not limited thereto. In some embodiments, the light emitting element ED may include a larger number of electrode layers 37, or the electrode layer 37 may be omitted. A description of the light emitting element ED to be described later may be equally applied even if the number of electrode layers 37 is changed or the light emitting element ED further includes other structures.

In case that the light emitting element ED is electrically connected to an electrode or a contact electrode in the display device 10 according to an embodiment, the electrode layer 37 may reduce resistance between the light emitting element ED and the electrode or the contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with n-type or p-type impurities. However, the electrode layer 37 is not limited thereto.

The insulating film 38 is disposed to surround the outer surfaces of the above-described semiconductor layers and electrode layers. For example, the insulating film 38 may be disposed to surround at least the outer surface of the light emitting layer 36, and may extend in one direction in which the light emitting element ED extends. The insulating film 38 may function to protect the members. For example, the insulating film 38 may surround the side surfaces of the members, and may be formed such that ends of the light emitting element ED in a length direction are exposed.

Although it is shown in FIG. 6 that the insulating film 38 may extend in the length direction of the light emitting element ED to cover the first semiconductor layer 31 to the side surface of the electrode layer 37, the embodiments are not limited thereto. The insulating film 38 may cover only the outer surface of a part of the semiconductor layer or cover only a part of the outer surface of the electrode layer 37 to expose a part of the outer surface of the electrode layer 37. The insulating film 38 may be formed to have a rounded cross-sectional upper surface in an area adjacent to at least one end of the light emitting element ED.

The thickness of the insulating film 38 may be in a range of about 10 nm to about 1.0 μm, but is not limited thereto. For example, the thickness of the insulating film 38 may be about 40 nm.

The insulating film 38 may include a material having insulating properties, for example, silicon oxide (SiOx), silicon nitride (SiNx), silicon oxynitride (SiOxNy), or aluminum oxide ($Al_2O_3$). Thus, the light emitting layer 36 may prevent an electrical short that may occur when the light emitting layer 36 is in direct contact with an electrode through which an electrical signal is transmitted to the light emitting element ED. Since the insulating film 38 protects the outer surface of the light emitting element ED as well as the light emitting layer 36, it may be possible to prevent the deterioration in light emission efficiency.

In some embodiments, the outer surface of the insulating film 38 may be surface-treated. The light emitting elements ED may be aligned by being sprayed onto the electrodes in a state in which they are dispersed in an ink. The surface of the insulating film 38 may be hydrophobically or hydrophilically treated in order to maintain the light emitting elements ED in a dispersed state without being aggregated with other adjacent light emitting elements ED in the ink.

The length h of the light emitting element ED may be in a range of about 1 μm to about 10 μm or about 2 μm to about 6 μm, and preferably about 3 μm to about 5 μm. The diameter of the light emitting element ED may be in a range of about 30 nm to about 700 nm, and the aspect ratio of the light emitting element ED may be in a range of about 1.2 to about 100. However, the dimensions of the light emitting element ED are not limited thereto, and the light emitting elements ED included in the display device 10 may have different diameters according to the composition difference of the light emitting layer 36. For example, the diameter of the light emitting element ED may be in a range of about 500 nm.

Figure 7:
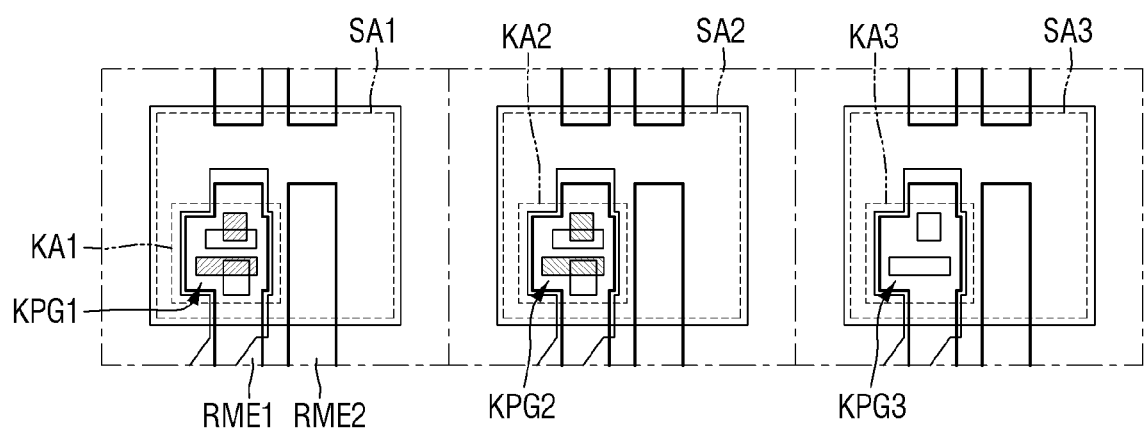
FIG. 7 is a plan view illustrating sub-areas arranged in one pixel according to an embodiment.

FIG. 7 is a plan view illustrating sub-areas arranged in one pixel according to an embodiment.

Referring to FIG. 7, the display device 10 according to an embodiment may include measurement areas KA disposed in the sub-areas SA of each pixel PX. One pixel PX includes sub-pixels PXn, and each of the sub-pixels PXn includes a light emitting area EMA and a sub-area SA. Measurement areas KA may be disposed in the sub-areas SA of the sub-pixels PXn, respectively, and may include different measurement pattern groups KPG. The measurement areas KA, similarly to the sub-areas SA, may be arranged to be spaced apart in the first direction DR1. Although not shown in the drawings, any one measurement area KA may be spaced apart in the second direction DR2 from the measurement area KA of another pixel PX or sub-pixel PXn that is adjacent to the one measurement area KA in the second direction DR2.

For example, the first measurement area KA1 in which the first measurement pattern group KPG1 is disposed may be disposed in the first sub-area SA1 of the first sub-pixel PX1. The second measurement area KA2 in which the second measurement pattern group KPG2 is disposed may be disposed in the second sub-area SA2 of the second sub-pixel PX2, and the third measurement area KA3 in which the third measurement pattern group KPG3 is disposed may be disposed in the third sub-area SA3 of the third sub-pixel PX3. As described above, the first electrode extension portion CE1 of the first electrode RME1 and the bank extension portion BNL_E of the first bank BNL1 are disposed in the sub area SA. The first electrode extension portion CE1 and the bank extension portion BNL_E may be disposed in the measurement area KA, and each of the measurement pattern groups KPG1, KPG2, and KPG3 may be disposed on the first electrode extension portion CE1 within the measurement area KA.

Each of the measurement pattern groups KPG1, KPG2, and KPG3 may include at least one measurement pattern KP. The measurement patterns KP may correspond to the insulating layers PAS1, PAS2, and PAS3 and contact electrodes CNE1 and CNE2 of the light emitting area EMA, and may be disposed on a same layer. The measurement pattern KP may be formed together with the insulating layers PAS1, PAS2 and PAS3 and the contact electrodes CNE1 and CNE2 during the process of manufacturing the display device 10. The insulating layers PAS1, PAS2, and PAS3 and the contact electrodes CNE1 and CNE2 disposed in the light emitting area EMA of each pixel PX may be stacked while being spaced apart from each other or partially overlapping each other. The insulating layers PAS1, PAS2, and PAS3 and the contact electrodes CNE1 and CNE2 may be disposed in the light emitting area EMA in a pattern having a fine size, and the defective rate of the corresponding sub-pixel PXn may be reduced only when the relative arrangement therebetween is precisely controlled.

For example, when there is an error in the interval between the contact electrodes CNE1 and CNE2 or overlapping with the electrodes RME1 and RME2, any one of the contact electrodes CNE1 and CNE2 may not contact the light emitting element ED, and the sub-pixel PXn may have poor light emission. During the process of manufacturing the display device 10, in order to indirectly measure the relative position or overlapping relationship of the insulating layers PAS1, PAS2, PAS3 and the contact electrodes CNE1 and CNE2 in the light emitting area EMA, the display device 10 may include measurement patterns KP disposed in the sub-area SA of each sub-pixel PXn. The measurement patterns KP may be formed simultaneously with at least one of the insulating layers PAS1, PAS2, and PAS3 and the contact electrodes CNE1 and CNE2. The relative position or overlapping relationship of the insulating layers PAS1, PAS2, PAS3 and the contact electrodes CNE1 and CNE2 in the light emitting area EMA may be indirectly measured through the relative arrangement relationship between the measurement patterns KP.

However, a large number of layers are sequentially stacked in the light emitting area EMA, and measurement patterns KP may be stacked with a large number of layers corresponding thereto. When the measurement patterns KP are sequentially stacked in the sub-area SA and the measurement area KA having a relatively narrow area, an error may occur in the interval between the measurement patterns KP, which is desired to be precisely controlled, due to the step formed by stacking the respective layers. In order to prevent the error, in the display device 10 according to an embodiment, measurement areas KA; KA1, KA2, and KA3 are disposed in one pixel PX, and measurement areas KA may include different measurement pattern groups KPG1, KPG2, and KPG3, respectively.

Figure 8:
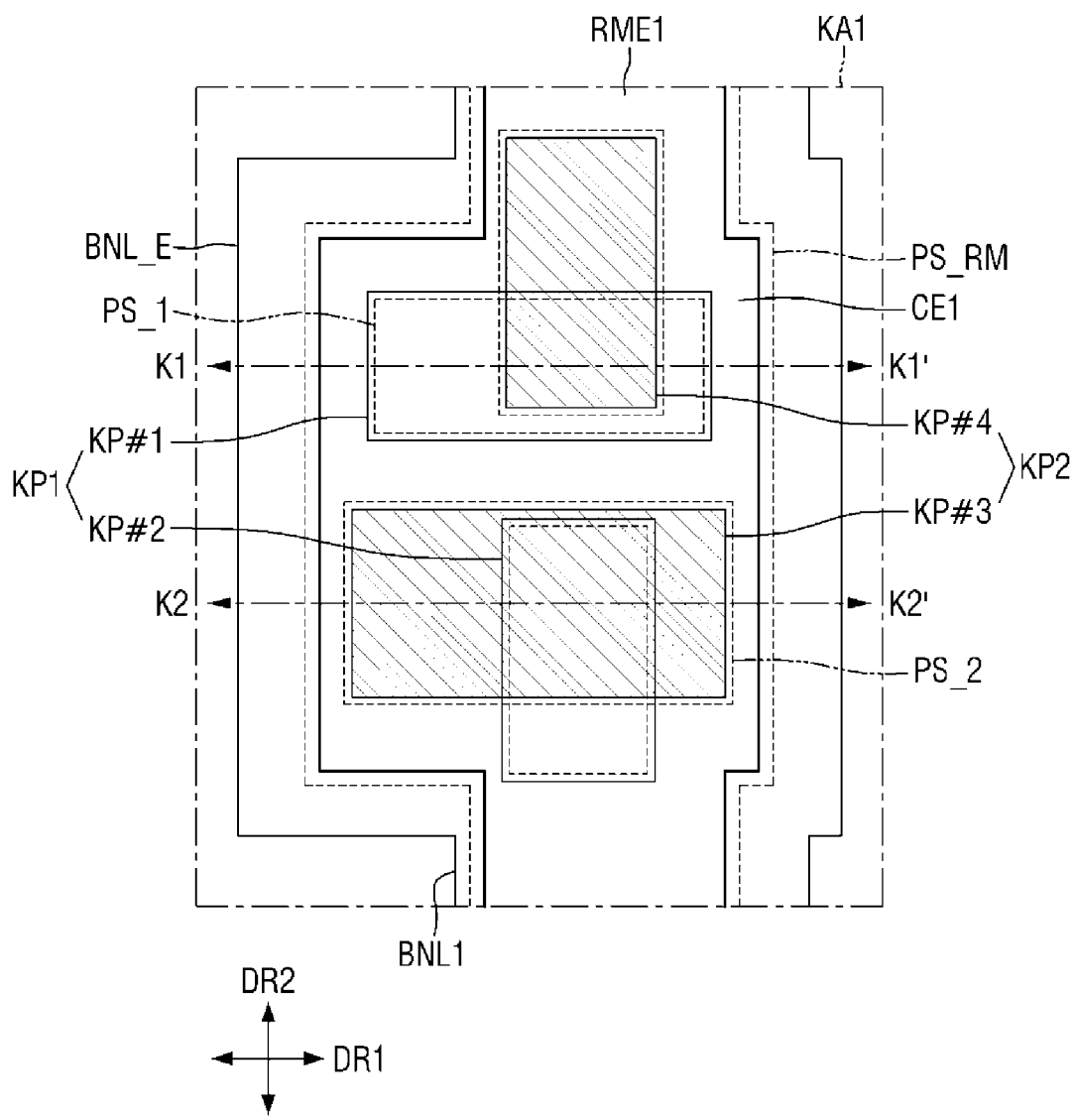
FIG. 8 is a plan view illustrating a first measurement area of FIG. 7.
Figure 9:
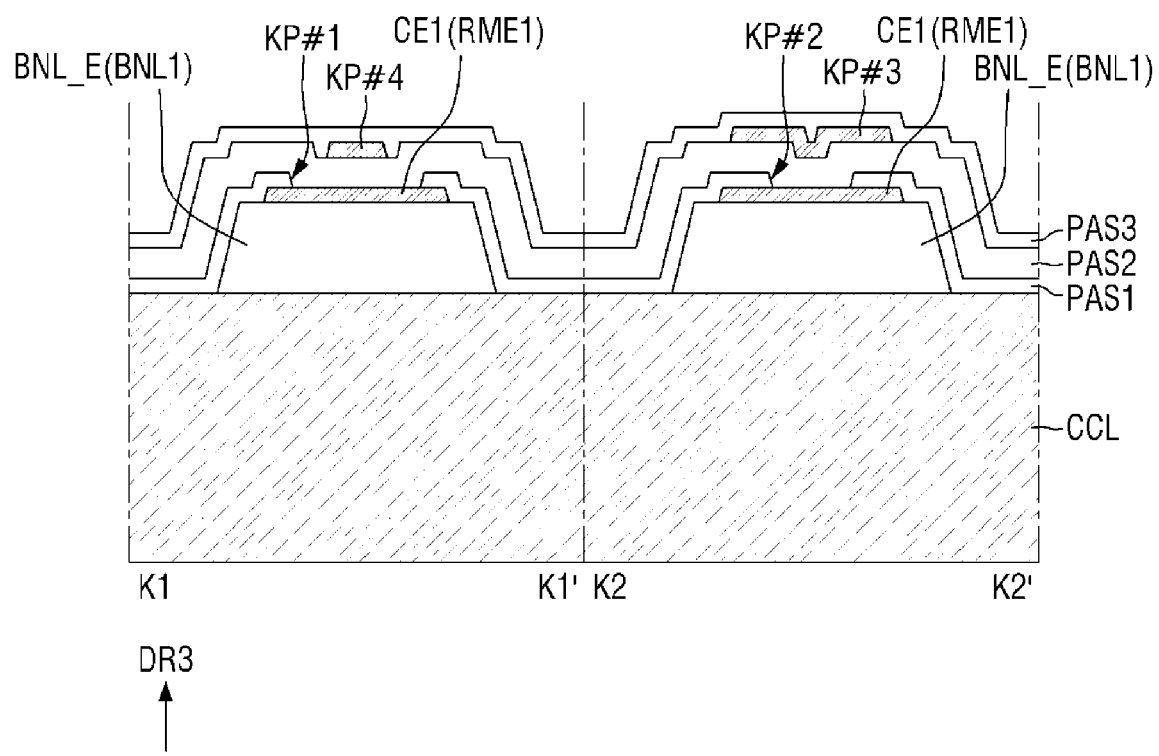
FIG. 9 is a schematic cross-sectional view taken along the lines K1-K1' and K2-K2' of FIG. 8.
Figure 10:
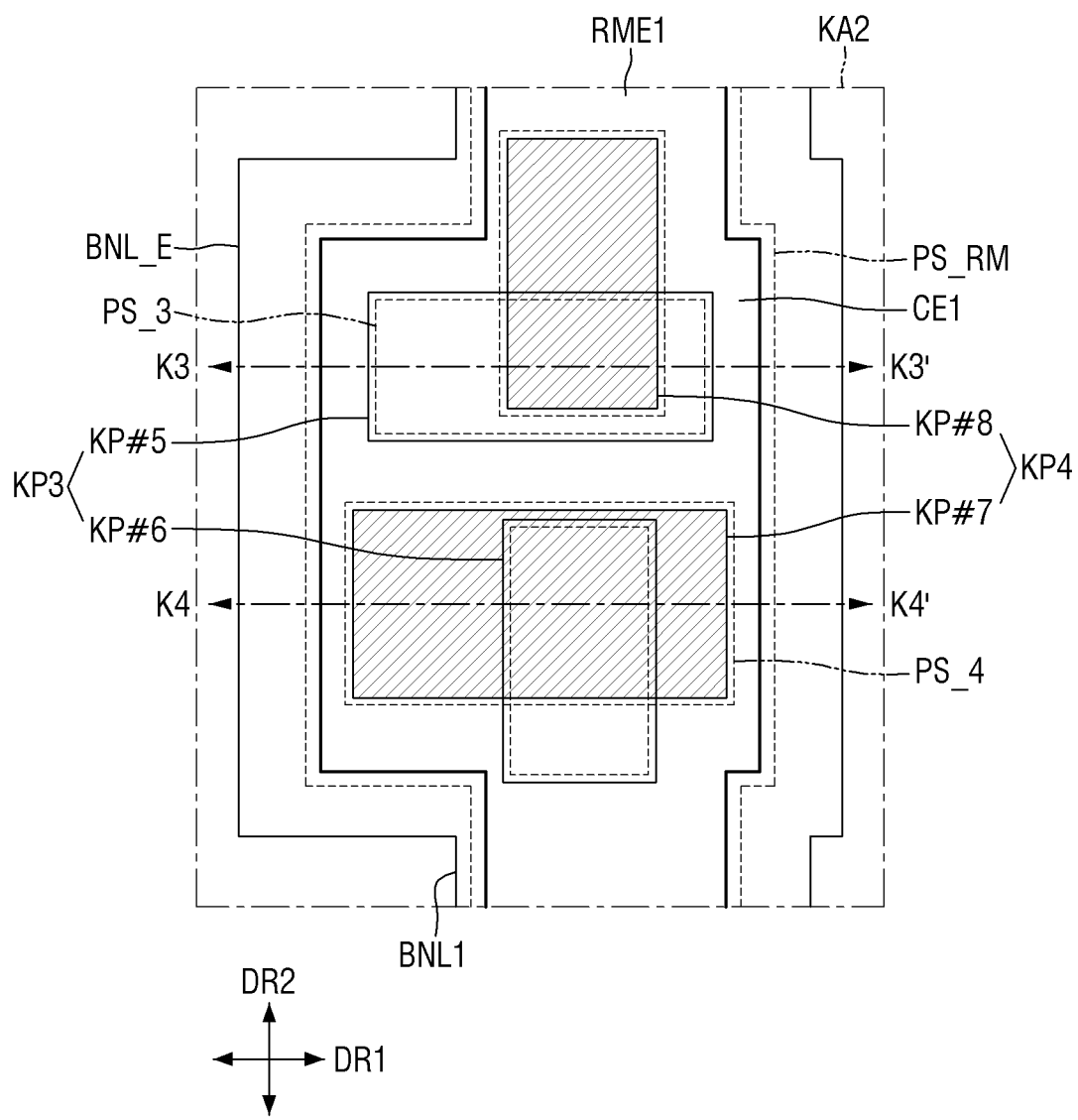
FIG. 10 is a plan view illustrating a second measurement area of FIG. 7.
Figure 11:
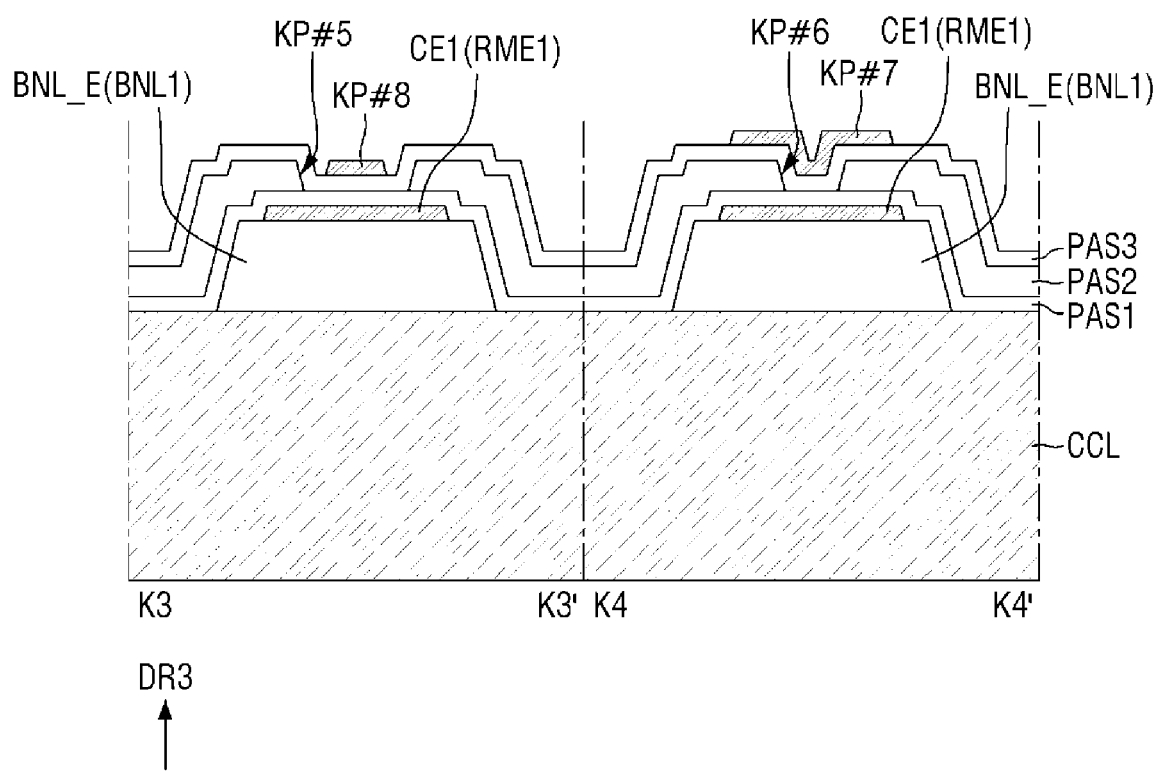
FIG. 11 is a schematic cross-sectional view taken along the lines K3-K3' and K4-K4' of FIG. 10.
Figure 12:
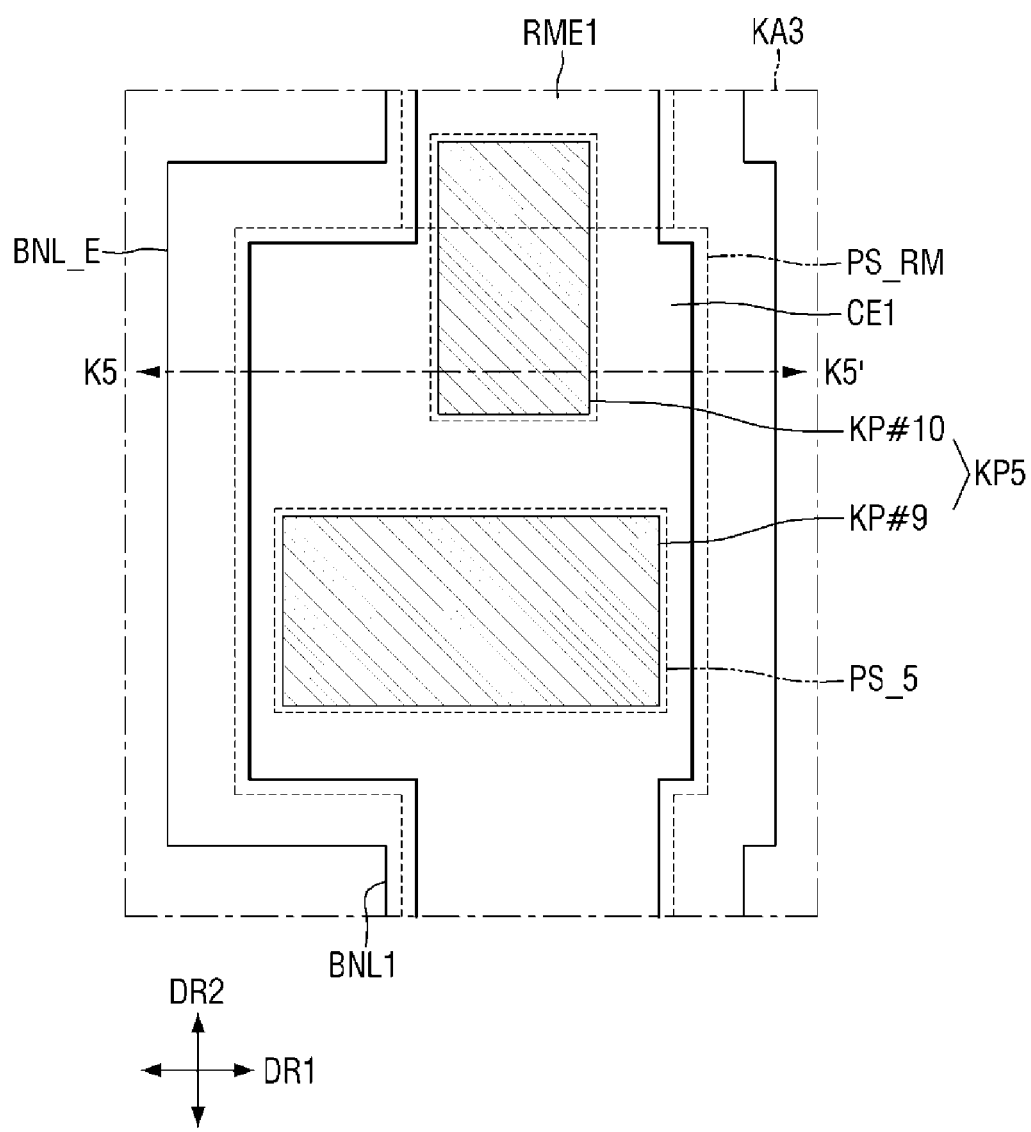
FIG. 12 is a plan view illustrating a third measurement area of FIG. 7.
Figure 13:
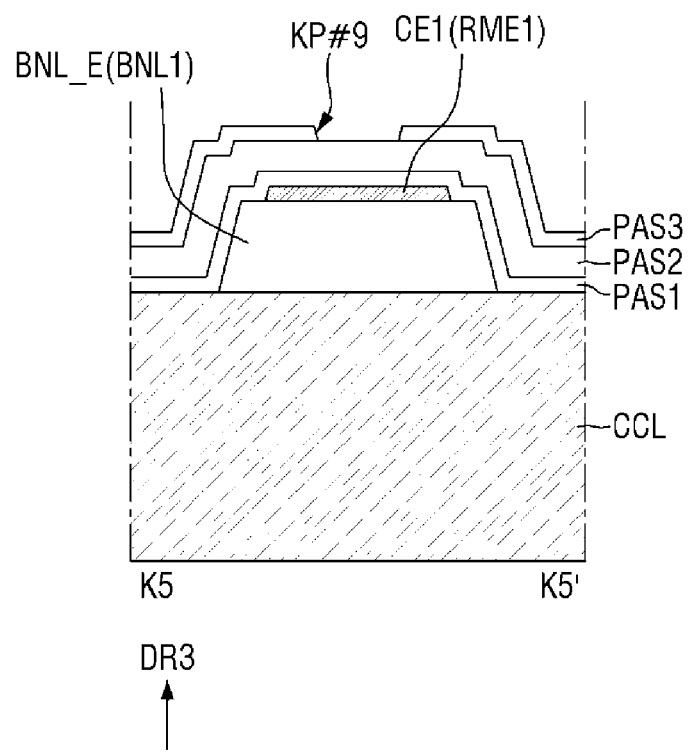
FIG. 13 is a schematic cross-sectional view taken along the line K5-K5' of FIG. 12.

FIG. 8 is a plan view illustrating a first measurement area of FIG. 7. FIG. 9 is a schematic cross-sectional view taken along the lines K1-K1' and K2-K2' of FIG. 8. FIG. 10 is a plan view illustrating a second measurement area of FIG. 7. FIG. 11 is a schematic cross-sectional view taken along the lines K3-K3' and K4-K4' of FIG. 10. FIG. 12 is a plan view illustrating a third measurement area of FIG. 7. FIG. 13 is a schematic cross-sectional view taken along the line K5-K5' of FIG. 12.

FIGS. 8 and 9 are a plan view and a schematic cross-sectional view illustrating a relative arrangement of a first measurement hole KP1, a first measurement electrode KP2, and a first electrode extension portion CE1, which are measurement patterns KP disposed in the first measurement area KA1. FIGS. 10 and 11 illustrate a second measurement hole KP3 and a second measurement electrode KP4 disposed in the second measurement area KA2 of the second sub-pixel PX2, and FIGS. 12 and 13 illustrate a third measurement hole KP5 disposed in the third measurement area KA3 of the third sub-pixel PX3.

Referring to FIGS. 8 to 13 in conjunction with FIG. 7, a bank extension portion BNL_E of the first bank BNL1 and a first electrode extension portion CE1 of the first electrode RME1 are disposed in the measurement area KA of each sub-pixel PXn. The width of the bank expansion portion BNL_E, measured in the first direction DR1 and the second direction DR2 in a plan view, may be greater than the width of the first electrode expansion portion CE1. The first electrode extension portion CE1 may be disposed on a flat upper surface formed by the bank extension portion BNL_E. The first electrode extension portion CE1 may form a flat surface without a step due to a layer disposed thereon, and measurement patterns KP disposed thereon may also be formed flat without a step. Due to the first electrode extension portion CE1 disposed in the measurement area KA, the measurement pattern KP has almost no step, and an error occurring when measuring a relative arrangement during a manufacturing process may be decreased.

In each measurement area KA, at least a first insulating layer PAS1, a second insulating layer PAS2, and a third insulating layer PAS3 may be sequentially stacked on the first electrode extension portion CE1. However, in different measurement areas KA; KA1, KA2, KA3 from each other, the shape of each of the insulating layers PAS1, PAS2, and PAS3 may be changed depending on the type of measurement pattern KP disposed therein, and other layers (for example, first measurement electrode KP2 and second measurement electrode KP4) may be further disposed therebetween.

A first measurement hole KP1 and a first measurement electrode KP2 may be disposed in the first measurement area KA1 of the first sub-pixel PX1. In an embodiment, the first measurement hole KP1 may be formed simultaneously with the first insulating layer PAS1 of the light emitting area EMA, and the first measurement electrode KP2 may be formed simultaneously with the first contact electrode CNE1. For example, the first measurement hole KP1 may correspond to the first contact hole CNT1 and the second contact hole CNT2 that penetrate the first insulating layer PAS1 to expose a part of the upper surface of the first electrode extension portion CE1. The first measurement hole KP1 may include a hole pattern formed to expose the first electrode extension portion CE1 in the first measurement area KA1. The first measurement electrode KP2 may correspond to the first contact electrode CNE1 disposed on the second insulating layer PAS2. The first measurement electrode KP2 may be disposed on the second insulating layer PAS2 of the first measurement area KA1, and may include substantially the same material as the first contact electrode CNE1. For example, the first measurement electrode KP2 may include a transparent electrode material such as ITO, IZO, or ITZO. However, unlike the first contact electrode CNE1, the first measurement electrode KP2 may not directly contact the first electrode extension portion CE1.

Each of the first measurement hole KP1 and the first measurement electrode KP2 may include patterns having a width and extending in a specific direction. For example, the first measurement hole KP1 may include a first pattern portion KP #1 disposed adjacent to one side, for example, upper side of the first measurement hole KP1 in the second direction DR2 with respect to the center of the first electrode extension portion CE1 and having a shape extending in the first direction DR1, and a second pattern portion KP #2 spaced apart from the first pattern portion KP #1 and having a shape extending in the second direction DR2. The first measurement electrode KP2 may include a third pattern portion KP #3 spaced apart from the first pattern portion KP #1 in the second direction DR2 and having a shape extending in the first direction DR1, and a fourth pattern portion KP #4 spaced apart from the third pattern portion KP #3 in the second direction DR2 and having a shape extending in the second direction DR2. The first pattern portion KP #1 and the fourth pattern portion KP #4 partially overlap each other, and the second pattern portion KP #2 and the third pattern portion KP #3 may partially overlap each other. The width of the first pattern portion KP #1, measured in the first direction DR1, may be greater than the width of the fourth pattern portion KP #4, measured in the first direction DR1, and the length of the first pattern portion KP #1, measured in the second direction DR2, may be smaller than the length of the fourth pattern portion KP #4, measured in the second direction DR2. The width of the second pattern portion KP #2, measured in the first direction DR1, may be smaller than the width of the third pattern portion KP #3, measured in the first direction DR1, and the length of the second pattern portion KP #2, measured in the second direction DR2, may be greater than the length of the third pattern portion KP #3 measured in the second direction DR2.

Each of the first pattern portion KP #1 and the third pattern portion KP #3 may have a width in the first direction DR1 larger than that in the second direction DR2, so that each of the first pattern portion KP #1 and the third pattern portion KP #3 may be spaced apart from both sides, for example, left and right sides of the first electrode extension portion CE1 in the first direction DR1 at an interval. The first pattern portion KP #1 may be spaced apart from one side, for example, upper side of the first electrode extension portion CE1 in the second direction DR2 at an interval, and the third pattern portion KP #3 may be spaced apart from the other side, for example, lower side of the first electrode extension portion CE1 in the second direction DR2 at an interval. Each of the second pattern portion KP #2 and the fourth pattern portion KP #4 may have a width in the second direction DR2 greater than that in the first direction DR1, and may have a shape having a width and extending in the second direction DR2.

As the measurement patterns KP correspond to the insulating layers PAS1, PAS2, and PAS3 and contact electrodes CNE1 and CNE2 disposed in the light emitting area EMA, the relative arrangement of the insulating layers PAS1, PAS2, and PAS3 and contact electrodes CNE1 and CNE2 in the light emitting area EMA may be indirectly measured through the relative arrangement of the measurement patterns KP.

For example, as the first measurement hole KP1 corresponds to the contact holes CNT1 and CNT2 penetrating the first insulating layer PAS1 and the first measurement electrode KP2 corresponds to the first contact electrode CNE1, in the first measurement area KA1, the relative arrangement of the contact holes CNT1 and CNT2 formed in the first insulating layer PAS1 of each light emitting area EMA and the first contact electrode CNE1 may be confirmed. The relative positions of the contact holes CNT1 and CNT2 penetrating the first insulating layer PAS1 formed on the electrodes RME1 and RME2 may be measured by the interval between the first pattern portion KP #1 and each side of the first electrode extension portion CE1 in the first measurement hole KP1. When the interval between the first pattern portion KP #1 and each side of the first electrode extension portion CE1 has an error from a design value, it may mean that an error occurs in the positions of the contact holes CNT1 and CNT2 even in the light emitting area EMA of the corresponding pixel PX or sub-pixel PXn. The lengths and widths of the contact holes CNT1 and CNT2 formed in the light emitting area EMA may be measured through the length and width of the second pattern portion KP #2. When the length and width of the second pattern portion KP #2 have an error from the design value, it may mean that an error occurs in the sizes of the contact holes CNT1 and CNT2 even in the light emitting area EMA of the corresponding pixel PX or sub-pixel PXn.

Similarly, the relative position of the first contact electrode CNE1 formed on the electrodes RME1 and RME2 may be measured by the interval between the third pattern portion KP #3 and each side of the first electrode extension portion CE1 in the first measurement electrode KP2. When the interval between the third pattern portion KP #3 and each side of the first electrode extension portion CE1 has an error from a design value, it may mean that an error occurs in the position of the first contact electrode CNE1 even in the light emitting area EMA of the corresponding pixel PX or sub-pixel PXn. The length and width of the first contact electrode CNE1 formed in the light emitting area EMA may be measured through the length and width of the fourth pattern portion KP #4. When the length and width of the fourth pattern part KP #4 have an error from the design value, it may mean that an error occurs in the sizes of the first contact electrodes CNE1 even in the light emitting area EMA of the corresponding pixel PX or sub-pixel PXn.

A second measurement hole KP3 and a second measurement electrode KP4 may be disposed in the second measurement area KA2 of the second sub-pixel PX2. In an embodiment, the second measurement hole KP3 may be formed simultaneously with the second insulating layer PAS2 of the light emitting area EMA, and the second measurement electrode KP4 may be formed simultaneously with the second contact electrode CNE2. For example, the second measurement hole KP3 may correspond to a portion of the second insulating layer PAS2 that has been removed to expose ends of the light emitting element ED. The second measurement hole KP3 may include a hole pattern formed to expose a part of the upper surface of the first insulating layer PAS1 in the second measurement area KA2. The second measurement electrode KP4 may correspond to the second contact electrode CNE2 disposed on the third insulating layer PAS3. The second measurement electrode KP4 may be disposed on the third insulating layer PAS3 of the second measurement area KA2, and may include substantially the same material as the second contact electrode CNE2. For example, the second measurement electrode KP4 may include a transparent electrode material such as ITO, IZO, or ITZO.

Each of the second measurement hole KP3 and the second measurement electrode KP4 may include patterns having a width and extending in a specific direction. For example, the second measurement hole KP3 may include a fifth pattern portion KP #5 disposed adjacent to one side, for example, upper side of the second measurement hole KP3 in the second direction DR2 with respect to the center of the first electrode extension portion CE1 and having a shape extending in the first direction DR1, and a sixth pattern portion KP #6 spaced apart from the fifth pattern portion KP #5 and having a shape extending in the second direction DR2. The second measurement electrode KP4 may include a seventh pattern portion KP #7 spaced apart from the fifth pattern portion KP #5 in the second direction DR2 and having a shape extending in the first direction DR1, and an eighth pattern portion KP #8 spaced apart from the seventh pattern portion KP #7 in the second direction DR2 and having a shape extending in the second direction DR2. The fifth pattern portion KP #5 and the eighth pattern portion KP #8 partially overlap each other, and the sixth pattern portion KP #6 and the seventh pattern portion KP #7 may also partially overlap each other. The width of the fifth pattern portion KP #5, measured in the first direction DR1, may be greater than the width of the eighth pattern portion KP #8, measured in the first direction DR1, and the length of the fifth pattern portion KP #5, measured in the second direction DR2, may be smaller than the length of the eighth pattern portion KP #8, measured in the second direction DR2. The width of the sixth pattern portion KP #6, measured in the first direction DR1, may be smaller than the width of the seventh pattern portion KP #7, measured in the first direction DR1, and the length of the sixth pattern portion KP #6, measured in the second direction DR2, may be greater than the length of the seventh pattern portion KP #7, measured in the second direction DR2.

Similarly to the first pattern portion KP #1, each of the fifth pattern portion KP #5 and the seventh pattern portion KP #7 may have a width in the first direction DR1 larger than that in the second direction DR2, so that each of the fifth pattern portion KP #5 and the seventh pattern portion KP #7 may be spaced apart from both sides, for example, left and right sides of the first electrode extension portion CE1 in the first direction DR1 at an interval. The fifth pattern portion KP #5 may be spaced apart from one side, for example, upper side of the first electrode extension portion CE1 in the second direction DR2 at an interval, and the seventh pattern portion KP #7 may be spaced apart from the other side, for example, lower side of the first electrode extension portion CE1 in the second direction DR2 at an interval. Similarly to the second pattern portion KP #2, each of the sixth pattern portion KP #6 and the eighth pattern portion KP #8 may have a width in the second direction DR2 greater than that in the first direction DR1, and may have a shape having a width and extending in the second direction DR2.

The second measurement hole KP3 may correspond to a portion of the second insulating layer PAS2 that has been removed to expose ends of the light emitting element ED, and the second measurement electrode KP4 may correspond to the second contact electrode CNE2. As described above, the relative arrangement of the second insulating layer PAS2 and the second contact electrode CNE2 in the light emitting area EMA may be confirmed through the second measurement hole KP3 and the second measurement electrode KP4.

In case that the interval between the fifth pattern portion KP #5 and each side of the first electrode extension portion CE1 has an error from a design value, it may mean that an error occurs in the position of a portion exposed by the second insulating layer PAS2 even in the light emitting area EMA of the corresponding pixel PX or sub-pixel PXn. The length and width of a portion exposed by the second insulating layer PAS2 in the light emitting area EMA may be measured through the length and width of the sixth pattern portion KP #6.

Similarly, the relative position of the second contact electrode CNE2 formed on the electrodes RME1 and RME2 may be measured by the interval between the seventh pattern portion KP #7 and each side of the first electrode extension portion CE1 in the second measurement electrode KP4. The length and width of the second contact electrode CNE2 disposed in the light emitting area EMA may be measured through the length and width of the eighth pattern portion KP #8.

A third measurement hole KP5 may be disposed in the third measurement area KA3 of the third sub-pixel PX3. In an embodiment, the third measurement hole KP5 may be formed simultaneously with the third insulating layer PAS3 of the light emitting area EMA. For example, the third measurement hole KP5 may correspond to a portion of the third insulating layer PAS3 that has been removed to expose one end of the light emitting element ED. The third measurement hole KP5 may be a hole pattern formed to expose a part of the upper surface of the second insulating layer PAS2 in the third measurement area KA3. Unlike the first measurement area KA1 and the second measurement area KA2, only a hole corresponding to the third insulating layer PAS3 may be formed in the third measurement area KA3 without patterns corresponding to the contact electrodes CNE1 and CNE2.

The third measurement hole KP5 may also include patterns having a width and extending in a specific direction. For example, the third measurement hole KP5 may include a ninth pattern portion KP #9 disposed adjacent to the lower side of the third measurement hole KP5 with respect to the center of the first electrode extension portion CE1 and having a shape extending in the first direction DR1, and a tenth pattern portion KP #10 spaced apart from the ninth pattern portion KP #9 in the second direction DR2 and having a shape extending in the second direction DR2.

Similarly to the first pattern portion KP #1, the ninth pattern portion KP #9 may have a width in the first direction DR1 larger than that in the second direction DR2, so that the ninth pattern portion KP #9 may be spaced apart from both sides, for example, left and right sides of the first electrode extension portion CE1 in the first direction DR1 at an interval. The ninth pattern portion KP #9 may be spaced apart from the lower side of the first electrode extension portion CE1 by an interval. Similarly to the second pattern portion KP #2, the tenth pattern portion KP #10 may have a width in the second direction DR2 greater than that in the first direction DR1, and may have a shape having a width and extending in the second direction DR2. The relative arrangement of the third insulating layer PAS3 in the light emitting area EMA may be confirmed from the third measurement hole KP5.

In case that errors occur in the size and placement position of the insulating layers PAS1, PAS2, PAS3 and contact electrodes CNE1 and CNE2 disposed on the first and second electrodes RME1 and RME2 from design values, a connection failure may occur between the light emitting element ED and the first and second electrodes RME1 and RME2. In this case, a light emission defect may occur in the sub-pixel PXn, thereby causing a problem in product reliability. During the process of manufacturing the display device 10, whether or not the layers disposed in the light emitting area EMA of the corresponding sub-pixel PXn has an error from the design value from the process of sequentially forming each layer and the size and interval of the measurement pattern KP formed in the measurement area KA. In particular, since the measurement patterns KP are formed simultaneously with each of the layers disposed in the light emitting area EMA during the manufacturing process, immediately after the process of forming each layer, the measurement pattern KP may be checked to determine whether an error has occurred. In this case, since an error occurs before other layers or other measurement patterns KP are further stacked in the measurement area KA, there is an advantage in that it may be easy to check the distance between the measurement pattern KP and the first electrode extension CE1.

Since the first contact electrode CNE1 and the second contact electrode CNE2 include a transparent electrode material such as ITO, measurement using an inspection device may not be easy. However, since the first electrode extension portion CE1 is disposed in the measurement area KA, even if the measurement patterns KP corresponding to the contact electrodes CNE1 and CNE2 include a transparent material, the underlying electrode extension portion CE1 is disposed, so the inspection device can easily perform measurement.

The interval between the measurement patterns KP or between the measurement pattern KP and the first electrode extension portion CE1 or the width of each measurement pattern KP may not match the shape of each of the Insulating layers PAS1, PAS2, and PAS3 and contact electrodes CNE1 and CNE2 arranged in the light emitting area EMA. The measurement pattern KP disposed in the measurement area KA is used to check the relative arrangement of the insulating layers PAS1, PAS2, and PAS3 and contact electrodes CNE1 and CNE2 arranged in the light emitting area EMA, and the size thereof may be different from the size of each of the insulating layers PAS1, PAS2, and PAS3 and the contact electrodes CNE1 and CNE2. However, the relative interval and size between the measurement patterns KP may be substantially the same as the relative interval and size of the insulating layers PAS1, PAS2, and PAS3 and contact electrodes CNE1 and CNE2 arranged in the light emitting area EMA.

The first electrode RME1 and the first measurement electrode KP2 may be formed by entirely depositing a material constituting them and patterning the deposited material using a photoresist as a mask according to the shape thereof. In designing the shape and width of the first electrode RME1 and the first measurement electrode KP2, when the shape and width thereof are designed based on the size or interval of the photoresist functioning as a mask, the material of the first electrode RME1 or the first measurement electrode KP2 may be over-etched in the patterning process, and thus the first electrode RME1 and the first measurement electrode KP2 may have a size smaller than the design value. The shape of each of the first electrode RME1 and the first measurement electrode KP2 shown in the drawings represent the size of each of the electrodes or patterns formed according to the patterning process during the manufacturing process, and the design value based on the photoresist functioning as a mask may be larger than the size thereof.

For example, in the case of the first electrode RME1, when the shape of the first electrode RME1 and the interval between the first electrode RME1 and another layer are designed based on an electrode reference line PS_RM, the first electrode RME1 may have the shape shown in the drawing in the patterning process. Similarly, when the shape of each of the first measurement electrode KP2 and the second measurement electrode KP4 and the interval between each of the first measurement electrode KP2 and the second measurement electrode KP4 and another layer are designed based on a second reference line PS_2 and a fourth reference line PS_4, each of the first measurement electrode KP2 and the second measurement electrode KP4 may have the shape shown in the drawing in the patterning process of a layer including substantially the same material as the contact electrodes CNE1 and CNE2. Since the first electrode RME1, the first measurement electrode KP2, and the second measurement electrode KP4 are formed by a patterning process of removing other portions except for a portion having a shape, the actually remaining pattern based on the reference lines may have a smaller size.

In contrast, since the first measurement hole KP1 has a pattern of a hole penetrating the first insulating layer PAS1, when the shape of the first measurement hole KP1 and the interval between the first measurement hole KP1 and another layer are designed based on the first reference line PS_1, the first measurement hole KP1 may have the shape shown in the drawing in the patterning process of the first insulating layer PAS1. When the shape of each of the second measurement hole KP3 and the third measurement hole KP5 and the interval between each of the second measurement hole KP3 and the third measurement hole KP5 and another layer are designed based on a third reference line PS_3 and a fifth reference line PS_5, each of the second measurement hole KP3 and the third measurement hole KP5 may have the shape shown in the drawing. Since the first measurement hole KP1, the second measurement hole KP3, and the third measurement hole KP5 are formed by a patterning process of removing a portion having a shape, the actually remaining pattern or hole based on each of the reference lines PS_1, PS_3, and PS_5 may have a larger size.

In case that the widths of the measurement patterns KP arranged in the measurement area KA and the interval between the measurement pattern KP and another layer are designed based on the first reference line PS_1, PS_2, PS_3, PS_4, and PS_5, the actually remaining patterns or holes may have different sizes. In the process of manufacturing the display device 10, in order to form the measurement patterns KP, the sizes or intervals of the reference lines PS_1, PS_2, PS_3, PS_4, and PS_5 may be designed in consideration of actually remaining shapes. The errors during the manufacturing process may be determined by comparing the design values of the reference lines with the sizes and intervals of the actually remaining measurement patterns KP, and errors such as intervals or widths of the insulating layers PAS1, PAS2, and PAS3 and contact electrodes CNE1 and CNE2 in the light emitting area EMA may be determined through the errors of the measurement patterns KP.

Hereinafter, another embodiment of the display device 10 will be described with reference to other drawings.

Figure 14:
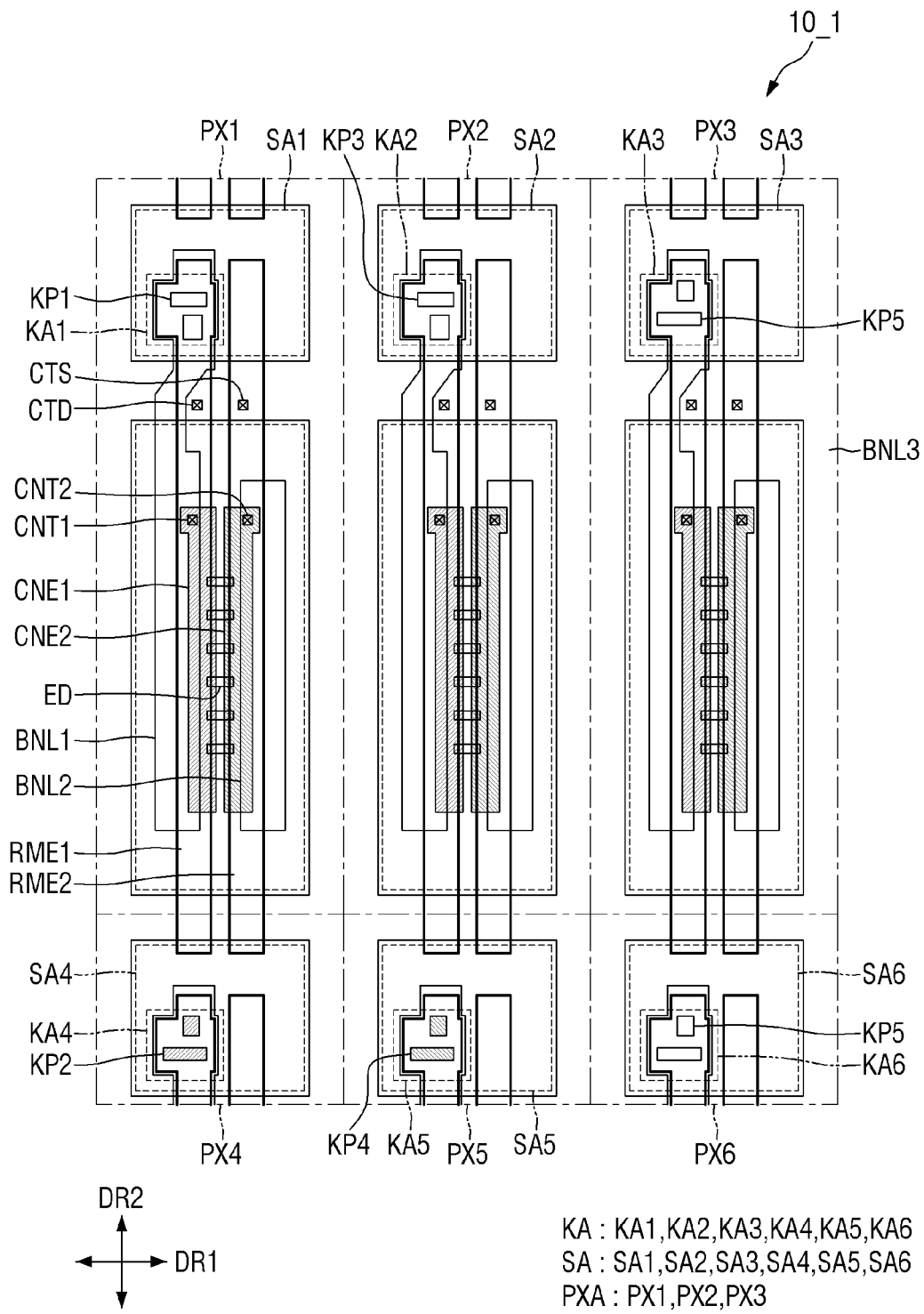
FIG. 14 is a plan view illustrating an arrangement of sub-areas of a display device according to another embodiment.

FIG. 14 is a plan view illustrating an arrangement of sub-areas of a display device according to another embodiment.

Referring to FIG. 14, in a display device 10_1 according to another embodiment, the first measurement hole KP1 and the first measurement electrode KP2, and the second measurement hole KP3 and the second measurement electrode KP4 may be disposed in different measurement areas KA from each other. In FIG. 7, the first to fifth measurement patterns KP1, KP2, KP3, KP4, and KP5 may be arranged in the measurement areas KA of the first to third sub-pixels PX1, PX2, and PX3 arranged in one pixel PX, whereas, in the embodiment, the first to fifth measurement patterns KP1, KP2, KP3, KP4, and KP5 may be arranged in the measurement areas KA of the first to sixth sub-pixels PX1, PX2, PX3, PX4, PX5, and PX6 arranged in two pixels PXA and PXB neighboring in the second direction DR2, respectively. The embodiment is different from the embodiment of FIG. 7 in that the first to fifth measurement patterns KP1, KP2, KP3, KP4, and KP5 are repeatedly arranged based on two pixels PX and six sub-pixels PXn. Hereinafter, redundant contents will be omitted, and differences will be mainly described.

First to third measurement areas KA1, KA2, and KA3 may arranged in the first pixel PXA of the display device 101, and a first measurement hole KP1, a second measurement hole KP3, and a third measurement hole KP5 may be disposed in the measurement areas, respectively. The first measurement hole KP1 may be disposed in the first measurement area KA1, the second measurement hole KP3 may be disposed in the second measurement area KA2, and the third measurement hole KP5 may be disposed in the third measurement area KA3. The second pixel PXB of the display device 10_1 includes a fourth sub-pixel PX4, a fifth sub-pixel PX5, and a sixth sub-pixel PX6. The fourth to sixth sub-pixels PX4, PX5, and PX6 include a fourth measurement area KA4, a fifth measurement area KA5, and a sixth measurement area KA6 together with a fourth sub-area SA4, a fifth sub-area SA5, and a sixth sub-area SA6, respectively. The first measurement electrode KP2 may be disposed in the fourth measurement area KA4, the second measurement electrode KP4 may be disposed in the fifth measurement area KA5, and the third measurement hole KP5 may be disposed in the sixth measurement area KA6 in substantially the same manner as the third measurement area KA3. As the measurement patterns KP are arranged so as not to overlap each other, other measurement patterns KP may not be stepped due to a step caused by the measurement pattern KP. Accordingly, in the display device 10_1 according to another embodiment, only one measurement pattern KP is disposed in one measurement area KA, so that it is easier to measure the size and interval of each measurement pattern KP.

Figure 15:
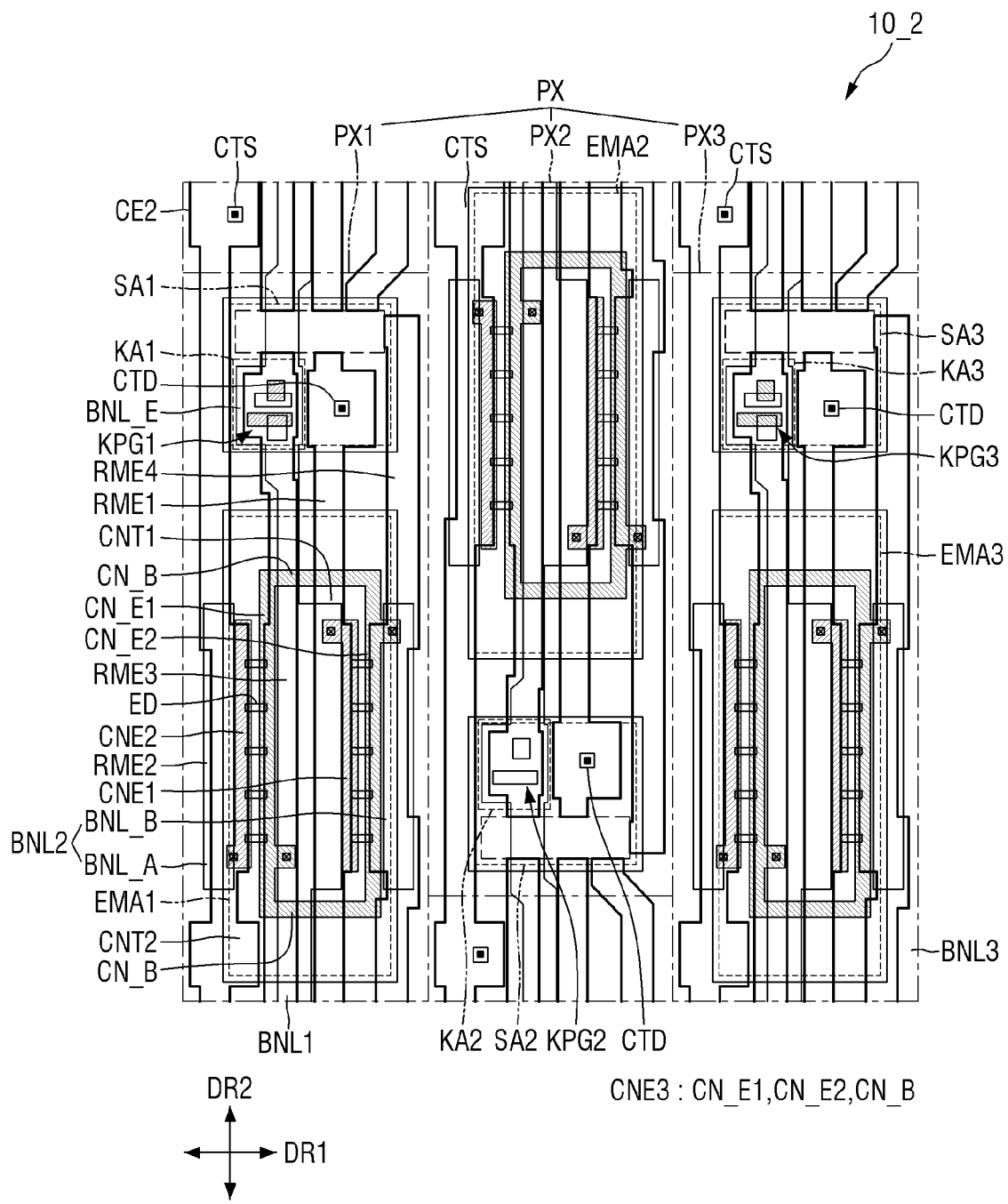
FIG. 15 is a plan view illustrating one pixel of a display device according to another embodiment.
Figure 16:
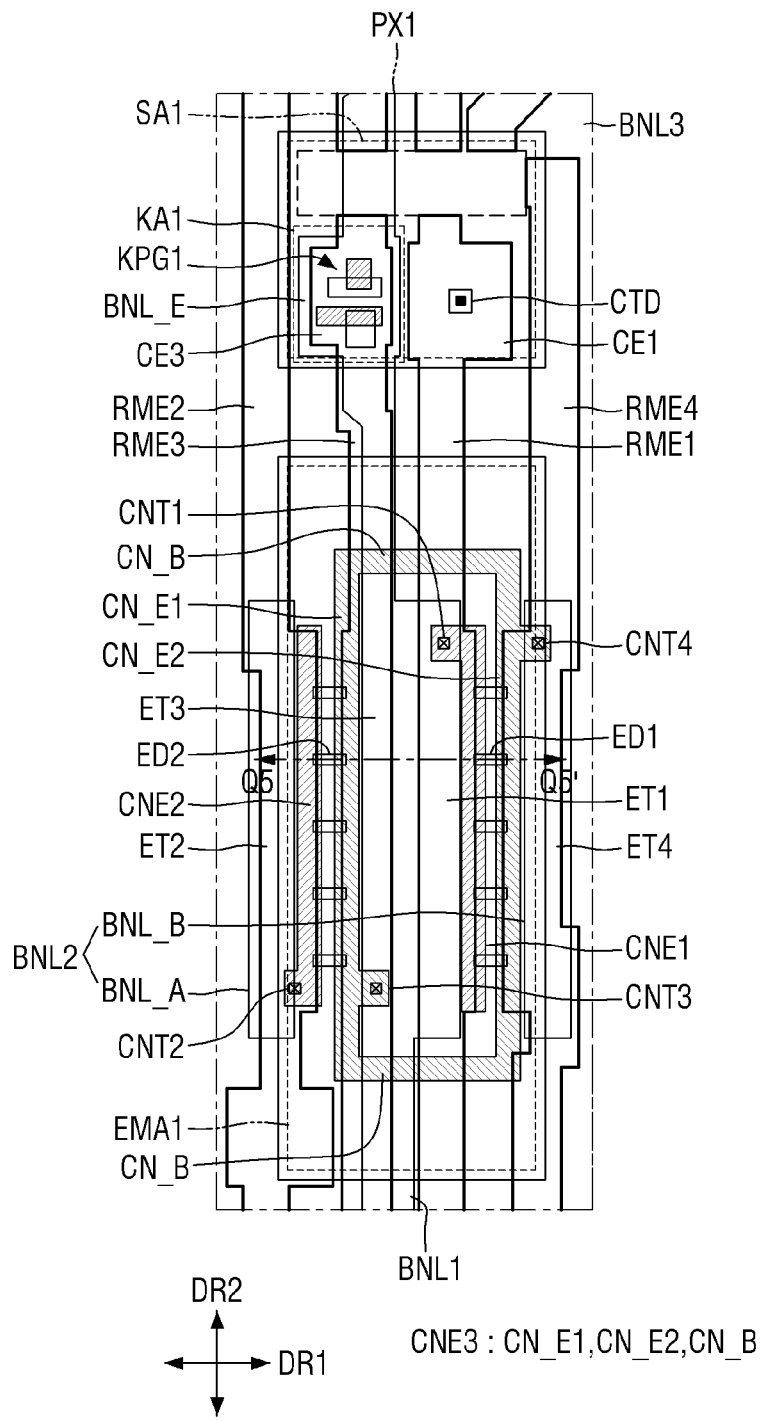
FIG. 16 is a plan view illustrating a first sub-pixel of FIG. 15.
Figure 17:
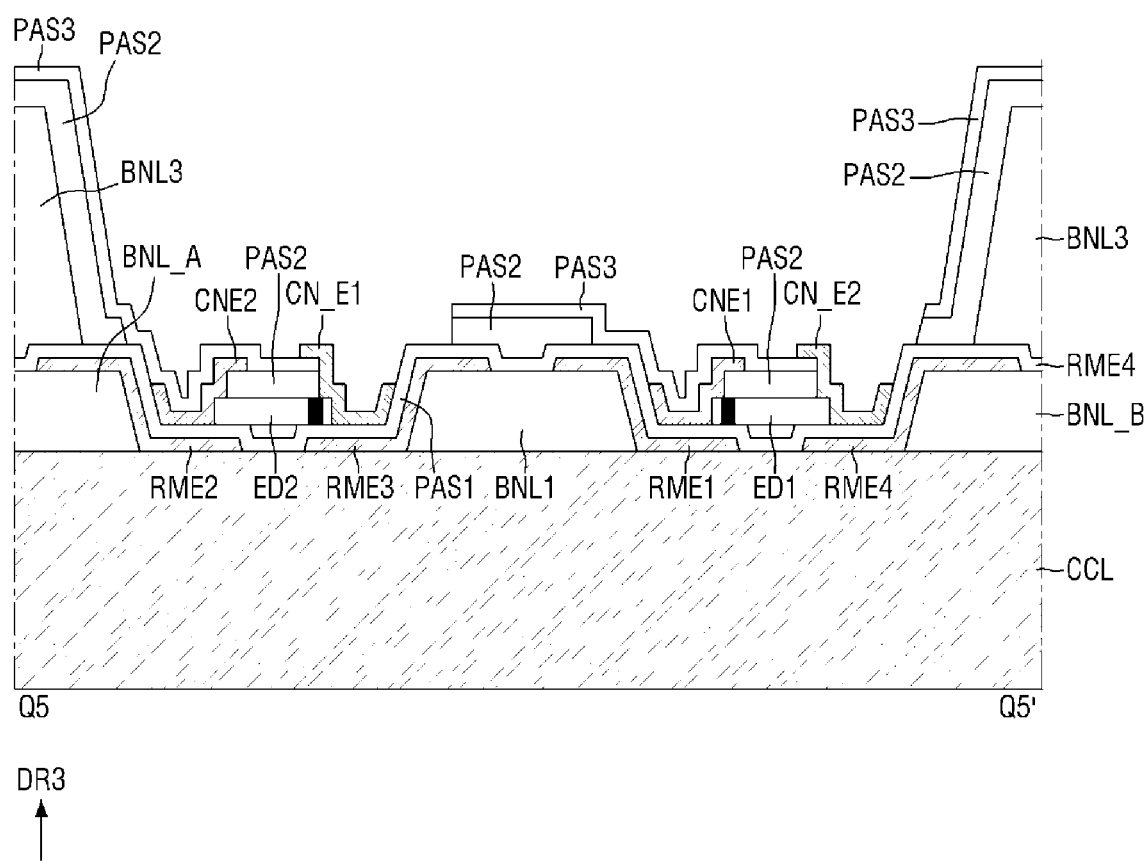
FIG. 17 is a schematic cross-sectional view taken along the line Q5-Q5' of FIG. 16.

FIG. 15 is a plan view illustrating one pixel of a display device according to another embodiment. FIG. 16 is a plan view illustrating a first sub-pixel of FIG. 15. FIG. 17 is a schematic cross-sectional view taken along the line Q5-Q5' of FIG. 16.

Referring to FIGS. 15 to 17, a display device 10_2 according to another embodiment may include a larger number of electrodes RME1, RME2, RME3, RME4, a larger number of second banks BNL2, and a larger number of contact electrodes CNE1, CNE2, and CNE3 for each sub-pixel PXn. As the number of electrodes RME1, RME2, RME3, and RME4 arranged in each sub-pixel PXn is changed, the arrangement of the light emitting area EMA, sub-area SA, and measurement area KA in the sub-pixel PXn may also be changed. The embodiment is different from the embodiment of FIG. 2 in that the structures of the electrodes RME1, RME2, RME3, and RME4 of each sub-pixel PXn are changed. Hereinafter, redundant contents will be omitted, and differences will be mainly described.

One first bank BNL1 and second banks BNL2 may be arranged in each sub-pixel PXn. The first bank BNL1 may have substantially the same shape as that of the embodiment of FIGS. 2 and 3, but may be formed such that a part of the portion disposed in the light emitting area EMA has a large width. The first bank BNL1 is disposed between the second banks BNL2 in the light emitting area EMA, and the corresponding portion may have a large width. At least one of the electrodes RME1, RME2, RME3, and RME4 to be described later may be disposed on a portion of the first bank BNL1 having a large width in the light emitting area EMA.

The second banks BNL2 may be arranged in the light emitting area EMA of the sub-pixel PXn to be spaced apart from each other. For example, the second bank BNL2 may include sub-banks BNL_A and BNL_B spaced apart from each other in the first direction DR1 in each light emitting area EMA. The first sub-bank BNL_A may be disposed at the left side of the center of the light emitting area EMA, and the second sub-bank BNL_B may be disposed at the right side of the center of the light emitting area EMA. The first sub-bank BNL_A and the second sub-bank BNL_B may partially overlap a portion extending in the second direction DR2 of the third bank BNL3. Each of the sub-banks BNL_A and BNL_B may have a shape extending in the second direction DR2, but the length thereof may be shorter than the length of the opening area surrounded by the third bank BNL3 in the second direction DR2.

The electrodes RME1, RME2, RME3, and RME4 may have a shape extending in one direction, are spaced apart from each other, and are disposed for each sub-pixel PXn. For example, a first electrode RME1, a second electrode RME2, a third electrode RME3, and a fourth electrode RME4 may be disposed in one sub-pixel PXn, may extend in the second direction DR2, and may be spaced apart from each other in the first direction DR1. The first electrode RME1 and the third electrode RME3 may be partially disposed on the first bank BNL1, the second electrode RME2 may be partially disposed on the first sub-bank BNL_A, and the fourth electrode RME4 may be partially disposed on the second sub-bank BNL_B. In an embodiment, the electrodes RME1, RME2, RME3, and RME4 may include electrode counter portions ET1, ET2, ET3, and ET4 having larger widths than other portions, respectively, as portions disposed on the first bank BNL1 or the second bank BNL2. In the electrodes RME1, RME2, RME3, and RME4, the electrode counter portions ET1, ET2, ET3, and ET4 may be placed on one side of the first bank BNL1 or the second bank BNL2, and may extend in the second direction DR2.

For example, in the first electrode RME1, the first electrode counter portion ET1 may be disposed on one side of the first bank BNL1, facing the second sub-bank BNL_B, among sides of the first bank BNL1. The first electrode counter portion ET1 of the first electrode RME1 may be disposed on a portion of the first bank BNL1 having a large width and disposed in the light emitting area EMA, and a portion of the first electrode RME1 other than the first electrode counter portion ET1 may be disposed so as not to overlap the first bank BNL1. The first electrode RME1 may extend in the second direction DR2 to be disposed beyond the light emitting area EMA, but may be separated from the first electrode of another pixel PX neighboring in the second direction DR2 in the sub-area SA. The first electrode RME1 may extend in the second direction DR2 to be disposed over the pixels PX, and a part of the first electrode RME1 may be removed in the sub-area SA and separated to be disposed for each sub-pixel PXn. According to an embodiment, the first electrode RME1 may include a first electrode extension portion CE1 disposed in the sub-area SA, and the first electrode extension portion CE1 may contact the first conductive pattern CDP through the first electrode contact hole CTD penetrating the second interlayer insulating layer IL2.

In the third electrode RME3, the third electrode counter portion ET3 may be disposed on one side of the first bank BNL1, facing the first sub-bank BNL_A, among sides of the first bank BNL1. The third electrode RME3 may have substantially the same shape as the first electrode RME1 and may be disposed on the first bank BNL1 to be spaced apart from the first electrode RME1. The third electrode counter portion ET3 of the third electrode RME3 may be disposed on a portion of the first bank BNL1 having a large width and disposed in the light emitting area EMA, and other portions of the third electrode RME3 except for the third electrode counter portion ET3 may be disposed on the first bank BNL1 and extend in the second direction DR2. The third electrode RME3 may include a third electrode extension portion CE3 disposed in the sub-area SA, and the third electrode extension portion CE3 may be disposed on the bank extension portion BNL_E of the first bank BNL1. The third electrode extension CE3 may be disposed in the measurement area KA in the sub-area SA, and the measurement pattern KP and measurement pattern group KPG of each measurement area KA may be disposed on the third electrode extension CE3.

In the second electrode RME2, the second electrode counter portion ET2 may be disposed on one side of the first sub-bank BNL_A, facing the first bank BNL1, among sides of the first sub-bank BNL_A. In the second electrode RME2, other portions except for the second electrode counter portion ET2 may be disposed to overlap the first sub-bank BNL_A, and may be disposed directly on the second interlayer insulating layer IL2. In the second electrode RME2, a part of the second electrode counter portion ET2 may be disposed in the light emitting area EMA, and another part of the second electrode counter portion ET2 may be disposed to overlap the third bank BNL3 and, substantially, may extend from the lower portion of the third bank BNL2 in the second direction DR2. The second electrode RME2 may extend in the second direction DR2 to be disposed beyond the light emitting area EMA and the sub-area SA, and one second electrode RME2 may be disposed over the pixels PX neighboring in the second direction DR2. Unlike the first electrode RME1, the second electrode RME2 may not be separated from the sub-area SA. According to an embodiment, the second electrode RME2 may include a second electrode extension portion CE2 disposed at the boundary with the pixel PX neighboring in the second direction DR2 and overlapping the second voltage line VL2 in the thickness direction. The second electrode extension portion CE2 may contact the second voltage line VL2 through the second electrode contact hole CTS penetrating the second interlayer insulating layer IL2.

The second electrode RME2 may include second electrode extensions CE2. Any one second electrode extension portion CE2 may be electrically connected to the second voltage line VL2 through the second electrode contact hole CTS, but another second electrode extension portion CE2 may not be electrically connected to the third conductive layer. The second electrode extension portions CE2 may alternately form the second electrode contact hole CTS to be electrically connected to the second voltage line VL2, but the embodiments are not limited thereto.

In the fourth electrode RME4, the fourth electrode counter portion ET4 may be disposed on one side of the second sub-bank BNL_B, facing the first bank BNL1, among sides of the second sub-bank BNL_B. In the fourth electrode RME4, other portions except for the fourth electrode counter portion ET4 may be disposed so as not to overlap the second sub-bank BNL_B, and may thus be disposed directly on the second interlayer insulating layer IL2. Similarly to the second electrode RME2, the fourth electrode RME4 may extend in the second direction DR2 to be disposed beyond the light emitting area EMA and the sub-area SA. However, unlike the second electrode RME2, the fourth electrode RME4 may be separated from the fourth electrode RME4 of the adjacent another pixel PX in the sub-area SA. The fourth electrode RME4 does not include an electrode contact portion, and may be substantially disposed in a symmetrical structure with the second electrode RME2 except that it is separated from the sub-area SA.

In the electrodes RME1, RME2, RME3, and RME4, the intervals between the electrode counter portions ET1, ET2, ET3, and ET4 may be smaller than the intervals between portions other than the electrode counter portions ET1, ET2, ET3, and ET4, respectively. Light emitting elements ED may be disposed on the electrode counter portions ET1, ET2, ET3, and ET4. Each of the electrode counter portions ET1, ET2, ET3, and ET4 may be disposed on an inclined side of the first bank BNL1 or the second bank BNL2, and the width of each of the electrode counter portions ET1, ET2, ET3, and ET4, measure in the first direction DR1, may be smaller than the width of each of the first bank BNL1 and the second bank BNL2, measure in the first direction DR1. In the electrodes RME1, RME2, RME3, and RME4, each of the electrode counter portions ET1, ET2, ET3, and ET4 may be disposed to cover at least one side of the first bank BNL1 or the second bank BNL2 to reflect light emitted from the light emitting element ED.

The light emitting element ED may be disposed on each electrode RME1, RME2, RME3, and RME4 between the first bank BNL1 and the second bank BNL2. The extended length of the light emitting element ED is longer than the interval between the electrodes RME1, RME2, RME3, and RME4 spaced apart in the first direction DR1, and ends of the light emitting element ED may be disposed on the electrodes RME1, RME2, RME3, and RME4 different from each other, respectively. As will be described later, the light emitting element ED may include semiconductor layers, and a first end and a second end opposite to the first end may be defined based on any one semiconductor layer. The light emitting elements ED may be divided into different light-emitting elements ED based on the electrode on which the first end is disposed.

For example, the light emitting element ED may include a first light emitting element ED1 having a first end disposed on the first electrode RME1 and a second end disposed on the fourth electrode RME4, and a second light emitting element ED2 having a first end disposed on the third electrode RME3 and a second end disposed on the second electrode RME2. In the first light emitting element ED1, between the first bank BNL1 and the second sub bank BNL_B, the first end may be placed on the first electrode counter portion ET1, and the second end may be placed on the fourth electrode counter portion ET4. In the second light emitting element ED2, between the first bank BNL1 and the first sub-bank BNL_A, the first end may be placed on the third electrode counter portion ET3, and the second end may be placed on the second electrode counter portion ET2. The light-emitting elements ED disposed in one sub-pixel PXn may include first and second light emitting elements ED1 and ED2 whose first ends face each other.

The ends of the light emitting element ED may contact the contact electrodes CNE1, CNE2, and CNE3, respectively. The second end of the first light emitting element ED1 and the first end of the second light emitting element ED2 may be electrically connected to each other through the same contact electrode, and thus the first light emitting element ED1 and the second light emitting element ED2 may be electrically connected in series with each other.

The contact electrodes CNE1, CNE2, and CNE3 may contact the light emitting element ED and the electrodes RME1, RME2, RME3, and RME4, respectively. The first contact electrode CNE1 may be disposed on the first electrode CNE1, and the second contact electrode CNE2 may be disposed on the second electrode CNE2. The first contact electrode CNE1 may be disposed on the first electrode counter portion ET1, and may have a shape having a narrower width than the first electrode counter portion ET1 and extending in the second direction DR2. The first contact electrode CNE1 may contact the first end of the first light emitting element ED1 and the first electrode RME1, respectively, and the first light emitting element ED1 may be electrically connected to the first electrode RME1 through the first contact electrode CNE1.

The second contact electrode CNE2 may be disposed on the second electrode counter portion ET2, and may have a shape having a narrower width than the second electrode counter portion ET2 and extending in the second direction DR2. The second contact electrode CNE2 may contact the second end of the second light emitting element ED2 and the second electrode RME2, respectively, and the second light emitting element ED2 may be electrically connected to the first electrode RME1 through the second contact electrode CNE2.

Each of the first contact electrode CNE1 and the second contact electrode CNE2 may be directly disposed on the second insulating layer PAS2. The first contact electrode CNE1 and the second contact electrode CNE2 may form a linear pattern having a smaller width than each of the electrodes RME1, RME2, RME3, and RME4 and extending in the second direction DR2 in the light emitting area EMA.

The third insulating layer PAS3 may be disposed on the first contact electrode CNE1 and the second contact electrode CNE2. The third insulating layer PAS3 may cover the first contact electrode CNE1 and the second contact electrode CNE2, and a part of the third insulating layer PAS3 may also be disposed on the second insulating layer PAS2.

The third contact electrode CNE3 may include a first extension portion CN_E1 disposed on the third electrode counter portion ET3, a second extension portion CN_E2 disposed on the fourth electrode counter portion ET4, and connection portions CN_B electrically connecting the first extension portion CN_E1 and the second extension portion CN_E2 to each other. The first extension portion CN_E1 and the second extension portion CN_E2 may have substantially similar shapes to the first contact electrode CNE1. The first extension portion CN_E1 and the second extension portion CN_E2 may have a shape having narrower widths than the third electrode counter portion ET3 and the fourth electrode counter portion ET4 and extending in the second direction DR2. However, the length of each of the first extension portion CN_E1 and the second extension portion CN_E2 may be longer than the length of the first contact electrode CNE1, which are measured in the second direction DR2, and the first extension portion CN_E1 and the second extension portion CN_E2 may be electrically connected to each other through the connection portions CN_B extending in the first direction DR1. The third contact electrode CNE3 may have a shape surrounding the first contact electrode CNE1 on a plan view.

The first extension portion CN_E1 and the second extension portion CN_E2 may contact the third electrode RME3 and the fourth electrode RME4, respectively, through the third contact hole CNT3 and the fourth contact hole CNT4 that penetrate the first insulating layer PAS1. The third contact hole CNT3 and the fourth contact hole CNT4 may be disposed so as not to overlap the light emitting elements ED in the first direction DR1.

A measurement area KA is disposed in the sub area SA of each sub pixel PXn, and the measurement area KA may be provided with a third electrode extension portion CE3 and a measurement pattern KP and measurement pattern group KPG thereon. The first measurement pattern group KPG1 may be disposed in the first measurement area KA1 of the first sub-pixel PX1, the second measurement pattern group KPG2 may be disposed in the second measurement area KA2 of the second sub-pixel PX2, and the third measurement pattern group KPG3 may be disposed in the third measurement area KA3 of the third sub-pixel PX3. Unlike the embodiment of FIG. 7, the second measurement pattern group KPG2 may include a third measurement hole KP5, and the third measurement pattern group KPG3 may include a second measurement hole KP3 and a second measurement electrode KP4.

According to an embodiment, the display device 10 may include sub-pixels PXn having different arrangements of light emitting areas EMA and sub-areas SA for each pixel PX. Some of the sub-pixels PXn may have different directions in which the sub-area SA is disposed based on the light emitting area EMA. For example, similarly to the configuration that the light emitting areas EMA and sub-areas SA of each sub-pixel PXn are alternately arranged along the second direction DR2, the light emitting areas EMA and sub-areas SA of different sub-pixels PXn from each other may be alternately arranged along the first direction DR1.

For example, in each of the first sub-pixel PX1 and the third sub-pixel PX3, the sub-area SA may be disposed at the upper side of the light emitting area EMA, which is one side of the light emitting area EMA in the second direction DR2, and in the second sub-pixel PX2, the sub-area SA may be disposed at the lower side of the light emitting area EMA, which is the other side of the light emitting area EMA in the second direction DR2. The light emitting areas EMA of the first to third sub-pixels PX1, PX2, and PX3 may be arranged so as not to be substantially parallel to each other in the first direction DR1. The first light emitting area EMA1 and the third light emitting area EMA3 may be substantially parallel to each other in the first direction DR1, and the sub-area SA of the second sub-pixel PX2 may be disposed between the first light emitting area EMA1 and the third light emitting area EMA3. Similarly, the sub-areas SA of the first and third sub-pixels PX1 and PX3 may be substantially parallel to each other in the first direction DR1, and the second light emitting area EMA2 may be disposed between the sub-areas SA thereof. As each of the first sub-pixel PX1 and the third sub-pixel PX3 and the second sub-pixel PX2 have different arrangements of light emitting areas EMA and sub-areas SA from each other, arrangements of light emitting elements ED and electrodes RME1, RME2, RME3, and RME4 may be different from each other according to the type of the sub-pixel PXn.

A display device according to an embodiment includes a measurement area disposed in a sub-area located at one side of a light emitting area. Measurement patterns including substantially the same material as the insulating layers and contact electrodes of the light emitting area are disposed in the measurement area, and the display device may indirectly measure the relative arrangement between the insulating layers and the contact electrodes in the light emitting area through the intervals between the measurement patterns.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
   a light emitting area and a sub-area disposed at a side of the light emitting area;
   a measurement area disposed in the sub-area, measurement patterns and a first electrode extension portion being disposed in the measurement area;
   a first electrode and a second electrode that are disposed in the light emitting area and spaced apart from each other, and face each other;
   a first insulating layer disposed on the first electrode and the second electrode, at least a part of the first insulating layer being disposed on the first electrode extension portion; and
   at least one light emitting element having ends disposed on the first electrode and the second electrode in the light emitting area,
   wherein the measurement area includes a first measurement area in which a first measurement hole exposing a part of an upper surface of the first electrode extension portion is disposed.

2. The display device of claim 1, further comprising:
   a second insulating layer disposed on the at least one light emitting element and at least partially disposed in the measurement area, wherein
   the measurement area further includes a second measurement area spaced apart from the first measurement area, and
   a second measurement hole exposing a part of an upper surface of the first insulating layer is disposed in the second measurement area.

3. The display device of claim 2, further comprising:
   a first measurement electrode disposed in the first measurement area and partially overlapping the first measurement hole; and
   a second measurement electrode disposed in the second measurement area and partially overlapping the second measurement hole.

4. The display device of claim 3, further comprising:
   a first contact electrode disposed in the light emitting area and contacting the first electrode and an end of the at least one light emitting element; and
   a second contact electrode disposed in the light emitting area and contacting the second electrode and another end of the at least one light emitting element, wherein
   the first measurement electrode and the first contact electrode include a same material, and
   the second measurement electrode and the second contact electrode include a same material.

5. The display device of claim 4, wherein each of the first measurement electrode and the second measurement electrode does not contact the first electrode extension portion.

6. The display device of claim 3, wherein
   the first measurement hole includes:
   a first pattern portion extending in a first direction; and
   a second pattern portion spaced apart from the first pattern portion in a second direction and extending in the second direction, and
   the first pattern portion is spaced apart from a side of the first electrode extension portion.

7. The display device of claim 6, wherein the first measurement electrode includes:
   a third pattern portion overlapping the second pattern portion, spaced apart from the first pattern portion in the second direction, and extending in the first direction, and
   a fourth pattern portion overlapping the first pattern portion, spaced apart from the second pattern portion in the second direction, and extending in second first direction.

8. The display device of claim 7, wherein
   a width of the first pattern portion in the first direction is greater than a width of the fourth pattern portion in the first direction, and
   a length of the first pattern portion in the second direction is shorter than a length of the fourth pattern portion in the second direction.

9. The display device of claim 3, wherein
   the second measurement hole includes:
   a fifth pattern portion extending in a first direction; and
   a sixth pattern spaced apart from the fifth pattern in a second direction and extending in the second direction, and
   the fifth pattern portion is spaced apart from a side of the first electrode extension portion.

10. The display device of claim 9, wherein the second measurement electrode includes:
    a seventh pattern portion overlapping the sixth pattern portion, spaced apart from the fifth pattern portion in the second direction, and extending in the first direction, and
    an eighth pattern portion overlapping the fifth pattern portion, spaced apart from the sixth pattern portion in the second direction, and extending in the second direction.

11. The display device of claim 3, wherein
the second insulating layer is disposed on the first insulating layer of the first measurement area, and
the first measurement electrode is directly disposed on the second insulating layer.

12. The display device of claim 11, further comprising:
a third insulating layer disposed on the at least one light emitting element and at least partially disposed in the measurement area, wherein
the third insulating layer is disposed on the second insulating layer of the measurement area, and
the second measurement electrode is disposed directly on the third insulating layer.

13. The display device of claim 12, wherein
the measurement area further includes a third measurement area spaced apart from the second measurement area, and
a third measurement hole exposing a part of an upper surface of the second insulating layer is disposed in the third measurement area.

14. The display device of claim 2, wherein the measurement area further includes:
a fourth measurement area spaced apart from the first measurement area and including a first measurement electrode directly disposed on the first insulating layer in which the first measurement hole is not disposed, and
a fifth measurement area spaced apart from the fourth measurement area and including a second measurement electrode directly disposed on the second insulating layer in which the second measurement hole is not disposed.

15. The display device of claim 1, wherein
the first electrode extension portion is directly connected to the first electrode and includes a first bank disposed under the first electrode and a second bank disposed under the second electrode, and
the first bank includes a bank extension portion disposed under the first electrode extension portion and having a larger width than a width of the first electrode extension portion.

16. A display device, comprising:
a light emitting area;
a sub-area disposed at a side of the light emitting area;
a measurement area disposed in the sub-area and including an electrode extension portion and measurement patterns disposed on the electrode extension portion,
wherein the measurement area includes:
a first insulating layer disposed on the electrode extension portion;
a second insulating layer disposed on the first insulating layer;
a third insulating layer disposed on the second insulating layer;
a first measurement hole penetrating the first insulating layer to expose a part of an upper surface of the electrode extension portion;
a first measurement area in which a first measurement electrode disposed on the second insulating layer and partially overlapping the first measurement hole is disposed,
a second measurement hole spaced apart from the first measurement area and penetrating the second insulating layer to expose a part of an upper surface of the first insulating layer, and
a second measurement area in which a second measurement electrode disposed on the third insulating layer and partially overlapping the second measurement hole is disposed.

17. The display device of claim 16, wherein
the first measurement hole includes:
a first pattern portion extending in a first direction and spaced apart from a side of the electrode extension portion; and
a second pattern portion spaced apart from the first pattern portion in a second direction and extending in the second direction, and
the first measurement electrode includes:
a third pattern portion overlapping the second pattern portion, spaced apart from the first pattern portion in the second direction, and extending in the first direction, and
a fourth pattern portion overlapping the first pattern portion, spaced apart from the second pattern portion in the second direction, and extending in the second direction.

18. The display device of claim 17, further comprising:
a third measurement area spaced apart from the second measurement area,
wherein a third measurement hole penetrating the third insulating layer to expose a part of an upper surface of the second insulating layer is disposed in the third measurement area.

19. The display device of claim 17, further comprising:
a first electrode disposed in the light emitting area and connected to the electrode extension portion;
a second electrode spaced apart from the first electrode;
at least one light emitting element arranged on the first electrode and the second electrode;
a first contact electrode contacting an end of the at least one light emitting element and the first electrode; and
a second contact electrode contacting another end of the at least one light emitting element and the second electrode, wherein
the first insulating layer is disposed between the at least one light emitting element and each of the first electrode and the second electrode, and
the second insulating layer is disposed between the at least one light emitting element and the first contact electrode.

20. The display device of claim 19, further comprising:
a first bank disposed under the first electrode; and
a second bank disposed under the second electrode,
wherein the first bank includes a bank extension portion disposed under the electrode extension portion and having a larger width than a width of the electrode extension portion.

* * * * *